US009990016B2

(12) United States Patent
Rangarajan et al.

(10) Patent No.: US 9,990,016 B2
(45) Date of Patent: Jun. 5, 2018

(54) CONTROLLING TEMPERATURE OF A SYSTEM MEMORY

(71) Applicant: Intel Corporation, Santa Clara, CA (US)

(72) Inventors: Thanunathan Rangarajan, Bangalore (IN); Vinayak P. Risbud, Bangalore (IN); Tabassum Yasmin, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/674,594

(22) Filed: Aug. 11, 2017

(65) Prior Publication Data

US 2017/0351308 A1    Dec. 7, 2017

Related U.S. Application Data

(63) Continuation of application No. 14/460,533, filed on Aug. 15, 2014, now Pat. No. 9,760,136.

(51) Int. Cl.
| | |
|---|---|
| *G06F 12/00* | (2006.01) |
| *G06F 1/20* | (2006.01) |
| *G11C 7/04* | (2006.01) |
| *G11C 29/20* | (2006.01) |
| *G11C 29/46* | (2006.01) |
| *G11C 29/00* | (2006.01) |

(Continued)

(52) U.S. Cl.
CPC ................ *G06F 1/206* (2013.01); *G11C 7/04* (2013.01); *G11C 29/20* (2013.01); *G11C 29/46* (2013.01); *G11C 29/76* (2013.01); *G11C 5/04* (2013.01); *G11C 2029/0407* (2013.01); *G11C 2029/0409* (2013.01); *Y02D 10/16* (2018.01)

(58) Field of Classification Search
CPC .... G06F 3/0619; G06F 3/0647; G06F 3/0653; G06F 3/0683
See application file for complete search history.

(56) References Cited

U.S. PATENT DOCUMENTS

| | | | |
|---|---|---|---|
| 5,163,153 | A | 11/1992 | Cole et al. |
| 5,522,087 | A | 5/1996 | Hsiang |
| 5,590,341 | A | 12/1996 | Matter |

(Continued)

FOREIGN PATENT DOCUMENTS

| | | |
|---|---|---|
| EP | 1 282 030 A1 | 5/2003 |
| KR | 10-2011-0100465 | 9/2011 |

OTHER PUBLICATIONS

Intel Developer Forum, IDF2010, Opher Kahn, et al., "Intel Next Generation Microarchitecture Codename Sandy Bridge: New Processor Innovations," Sep. 13, 2010, 58 pages.

(Continued)

*Primary Examiner* — Yong Choe
(74) *Attorney, Agent, or Firm* — Trop, Pruner & Hu, P.C.

(57) ABSTRACT

In an embodiment, a processor includes at least one core to execute instructions and a memory controller coupled to the at least one core. In turn, the memory controller includes a spare logic to cause a dynamic transfer of data stored on a first memory device coupled to the processor to a second memory device coupled to the processor, responsive to a temperature of the first memory device exceeding a thermal threshold. Other embodiments are described and claimed.

20 Claims, 20 Drawing Sheets

(51) Int. Cl.
*G11C 5/04* (2006.01)
*G11C 29/04* (2006.01)

(56) References Cited

U.S. PATENT DOCUMENTS

| | | | |
|---|---|---|---|
| 5,621,250 | A | 4/1997 | Kim |
| 5,931,950 | A | 8/1999 | Hsu |
| 6,748,546 | B1 | 6/2004 | Mirov et al. |
| 6,792,392 | B1 | 9/2004 | Knight |
| 6,823,516 | B1 | 11/2004 | Cooper |
| 6,829,713 | B2 | 12/2004 | Cooper et al. |
| 6,996,728 | B2 | 2/2006 | Singh |
| 7,010,708 | B2 | 3/2006 | Ma |
| 7,043,649 | B2 | 5/2006 | Terrell |
| 7,093,147 | B2 | 8/2006 | Farkas et al. |
| 7,111,179 | B1 | 9/2006 | Girson et al. |
| 7,194,643 | B2 | 3/2007 | Gonzalez et al. |
| 7,272,730 | B1 | 9/2007 | Acquaviva et al. |
| 7,412,615 | B2 | 8/2008 | Yokota et al. |
| 7,434,073 | B2 | 10/2008 | Magklis |
| 7,437,270 | B2 | 10/2008 | Song et al. |
| 7,454,632 | B2 | 11/2008 | Kardach et al. |
| 7,529,956 | B2 | 5/2009 | Stufflebeam |
| 7,539,885 | B2 | 5/2009 | Ma |
| 7,730,340 | B2 | 6/2010 | Hu et al. |
| 9,152,568 | B1 * | 10/2015 | Seigler ............ G06F 12/0866 |
| 2001/0044909 | A1 | 11/2001 | Oh et al. |
| 2002/0194509 | A1 | 12/2002 | Plante et al. |
| 2003/0061383 | A1 | 3/2003 | Zilka |
| 2004/0064752 | A1 | 4/2004 | Kazachinsky et al. |
| 2004/0098560 | A1 | 5/2004 | Storvik et al. |
| 2004/0139356 | A1 | 7/2004 | Ma |
| 2004/0268166 | A1 | 12/2004 | Farkas et al. |
| 2005/0022038 | A1 | 1/2005 | Kaushik et al. |
| 2005/0033881 | A1 | 2/2005 | Yao |
| 2005/0132238 | A1 | 6/2005 | Nanja |
| 2005/0289292 | A1 | 12/2005 | Morrow et al. |
| 2006/0050670 | A1 | 3/2006 | Hillyard et al. |
| 2006/0053326 | A1 | 3/2006 | Naveh |
| 2006/0059286 | A1 | 3/2006 | Bertone et al. |
| 2006/0069936 | A1 | 3/2006 | Lint et al. |
| 2006/0117202 | A1 | 6/2006 | Magklis et al. |
| 2006/0184287 | A1 | 8/2006 | Belady et al. |
| 2007/0005995 | A1 | 1/2007 | Kardach et al. |
| 2007/0016817 | A1 | 1/2007 | Albonesi et al. |
| 2007/0079294 | A1 | 4/2007 | Knight |
| 2007/0106827 | A1 | 5/2007 | Boatright et al. |
| 2007/0156992 | A1 | 7/2007 | Jahagirdar |
| 2007/0214342 | A1 | 9/2007 | Newburn |
| 2007/0239398 | A1 | 10/2007 | Song et al. |
| 2007/0245163 | A1 | 10/2007 | Lu et al. |
| 2008/0028240 | A1 | 1/2008 | Arai et al. |
| 2008/0250260 | A1 | 10/2008 | Tomita |
| 2009/0006871 | A1 | 1/2009 | Liu et al. |
| 2009/0150695 | A1 | 6/2009 | Song et al. |
| 2009/0150696 | A1 | 6/2009 | Song et al. |
| 2009/0158061 | A1 | 6/2009 | Schmitz et al. |
| 2009/0158067 | A1 | 6/2009 | Bodas et al. |
| 2009/0172375 | A1 | 7/2009 | Rotem et al. |
| 2009/0172428 | A1 | 7/2009 | Lee |
| 2009/0235105 | A1 | 9/2009 | Branover et al. |
| 2010/0115309 | A1 | 5/2010 | Carvalho et al. |
| 2010/0146513 | A1 | 6/2010 | Song |
| 2010/0191997 | A1 | 7/2010 | Dodeja et al. |
| 2011/0154090 | A1 | 6/2011 | Dixon et al. |
| 2011/0219274 | A1 | 9/2011 | Cho et al. |
| 2012/0079290 | A1 | 3/2012 | Kumar |
| 2012/0095719 | A1 | 4/2012 | Araki et al. |
| 2012/0114010 | A1 | 5/2012 | Branch |
| 2012/0246506 | A1 | 9/2012 | Knight |
| 2013/0061064 | A1 | 3/2013 | Ananthakrishnan et al. |
| 2013/0080803 | A1 | 3/2013 | Ananthakrishnan et al. |
| 2013/0080804 | A1 | 3/2013 | Ananthakrishnan et al. |
| 2013/0103900 | A1 * | 4/2013 | Chiu ............... G06F 11/004 711/112 |
| 2013/0111120 | A1 | 5/2013 | Ananthakrishnan et al. |
| 2013/0111121 | A1 | 5/2013 | Ananthakrishnan et al. |
| 2013/0111226 | A1 | 5/2013 | Ananthakrishnan et al. |
| 2013/0111236 | A1 | 5/2013 | Ananthakrishnan et al. |
| 2013/0275665 | A1 * | 10/2013 | Saraswat ............. G11C 7/04 711/106 |
| 2013/0290600 | A1 * | 10/2013 | Tzafrir ............. G06F 11/004 711/103 |
| 2013/0346774 | A1 | 12/2013 | Bhandaru et al. |
| 2014/0068290 | A1 | 3/2014 | Bhandaru et al. |
| 2014/0195829 | A1 | 7/2014 | Bhandaru et al. |
| 2014/0208141 | A1 | 7/2014 | Bhandaru et al. |

OTHER PUBLICATIONS

SPEC-Power and Performance, Design Overview V1.10, Standard Performance Information. Corp., Oct. 21, 2008, 6 pages.
International Searching Authority, "Notification of Transmittal of the International Search Report and the Written Opinion of the International Searching Authority," dated Sep. 16, 2015, in International application No. PCT/US2015/037879.
Intel Technology Journal, "Power and Thermal Management in the Intel Core Duo Processor," May 15, 2006, pp. 109-122.
Anoop Iyer, et al., "Power and Performance Evaluation of Globally Asynchronous Locally Synchronous Processors," 2002, pp. 1-11.
Greg Semeraro, et al., "Hiding Synchronization Delays in a GALS Processor Microarchitecture," 2004, pp. 1-13.
Joan-Manuel Parcerisa, et al., "Efficient interconnects for Clustered Microarchitectures," 2002, pp. 1-10.
Grigorios Magklis, et al., "Profile-Based Dynamic Voltage and Frequency Scalling for a Multiple Clock Domain Microprocessor," 2003, pp. 1-12.
Greg Semeraro, et al., "Dynamic Frequency and Voltage Control for a Multiple Clock Domain Architecture," 2002, pp. 1-12.
Greg Semeraro, "Energy-Efficient Processor Design Using Multiple Clock Domains with Dynamic Voltage and Frequency Scaling," 2002, pp. 29-40.
Diana Marculescu, "Application Adaptive Energy Efficient Clustered Architectures," 2004, pp. 344-349.
L. Benini, et al., "System-Level Dynamic Power Management," 1999, pp. 23-31.
Ravindra Jejurikar, et al., "Leakage Aware Dynamic Voltage Scaling for Real-Time Embedded Systems," 2004, pp. 275-280.
Ravindra Jejurikar, et al., "Dynamic Slack Reclamation With Procrastination Scheduling in Real-Time Embedded Systems," 2005, pp. 13-17.
R. Todling, et al., "Some Strategies for Kalman Filtering and Smoothing," 1996, pp. 1-21.
R.E. Kalman, "A New Approach to Linear Filtering and Prediction Problems," 1960, pp. 1-12.
Intel Corporation, "Intel 64 and IA-32 Architectures Software Developer's Manual," vol. 3 (3A, 3B & 3C): System Programming Guide, Feb. 2014, Chapter 14 Power and Thermal Management (14.1-14.9.5), 44 pages.
Intel Corporation, "Intel 64 and IA-32 Architectures Software Developer's Manual," vol. 3B: System Programming Guide, Part 2, Apr. 2016, Chapter 14 Power and Thermal Management (14.1-14.9.5), 42 pages.
Korea Intellectual Property Office, Office Action dated Feb. 20, 2018 in Korean Patent Application No. 10-2017-7001358.

* cited by examiner

CONTROLLING TEMPERATURE OF A SYSTEM MEMORY

This application is a continuation of U.S. patent application Ser. No. 14/460,533, filed Aug. 15, 2014, the content of which is hereby incorporated by reference.

TECHNICAL FIELD

Embodiments relate to thermal management of a memory.

BACKGROUND

In the modern datacenter and cloud environment, vast efforts are made to maintain Quality of Service (QoS) and eliminate system downtime. Owing to Green Computing initiatives and imperatives, in recent years many datacenters and cloud service providers are choosing to operate their facility at higher-ambient temperatures by increasing the operational ambient air temperature beyond recommended set points. While this philosophy brings about reductions in cooling costs and environmental impact, there can be downsides, including a net thermal stress on systems and their components, and occasional temperature excursions outside of normal operating ranges, which can adversely affect operation, device lifetime, and performance.

DETAILED DESCRIPTION

Figure 1:
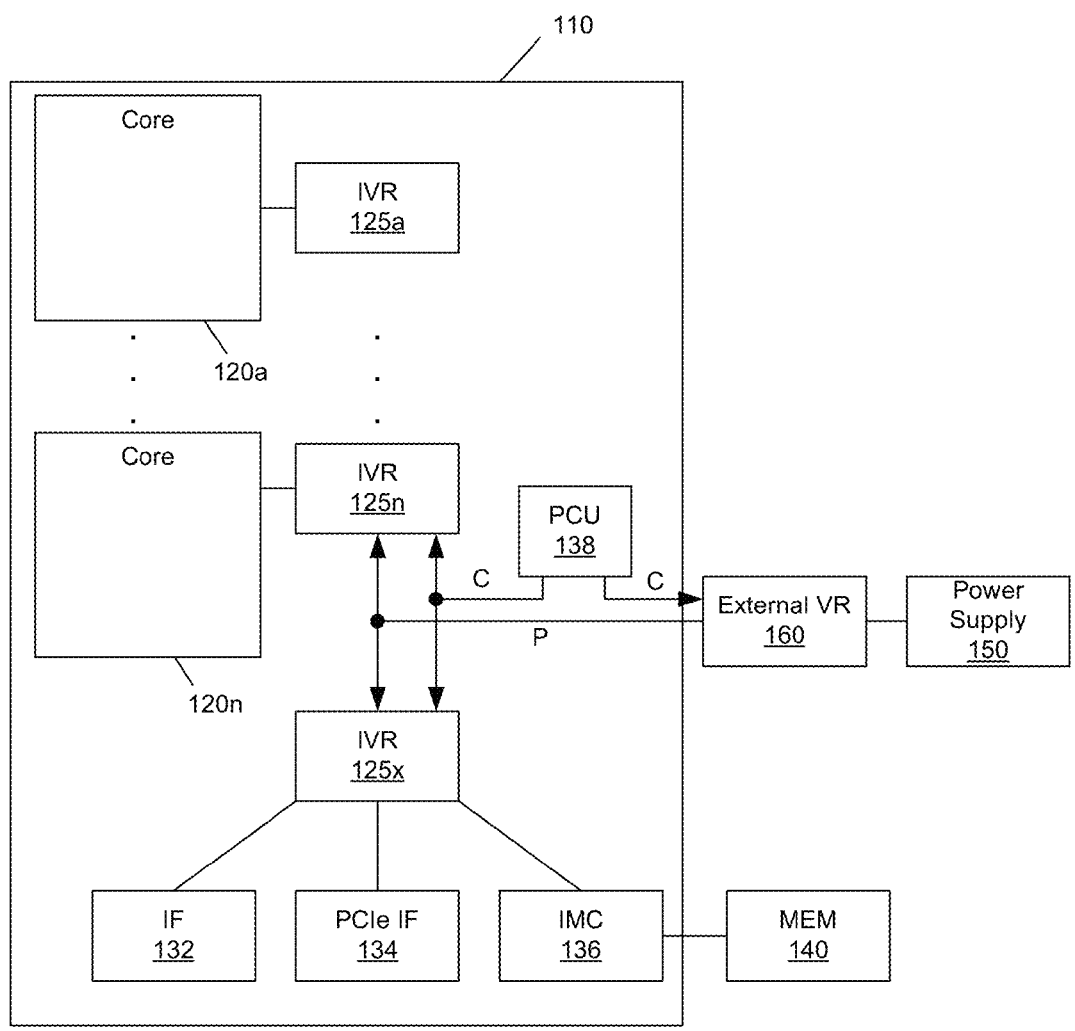
FIG. 1 is a block diagram of a portion of a system in accordance with an embodiment of the present invention.

In various embodiments, dynamic thermal management of memory devices may be performed during temperature excursions. Such thermal management techniques enable deferral of thermal throttling of memory devices by dynamically moving data (also referred to herein as dynamic hopping) between a thermally-affected primary device (e.g., a dual inline memory module (DIMM) or channel) and a spare device (e.g., DIMM or channel), until the thermal excursions are brought under control. This control may occur either due to natural means (e.g., a hot phase of a workload ends or an abnormal thermal event ends), or because of the balance achieved by the hopping operation. Using an embodiment of the present invention, the performance penalty associated with regular thermal throttling can be delayed or avoided.

Dynamic memory hopping in accordance with an embodiment can thus delay or avoid thermal throttling of memory devices. Such thermal throttling activates at or beyond a programmable threshold to control device temperatures by throttling activity/performance. However, thermal throttling impacts performance and is tantamount to downtime as far as service assurance is concerned. Hence, if a memory device is throttled, an entire service is impacted as the service may have to be suspended temporarily until the impacted portions of the service (e.g., one or more virtual machines) are migrated to a new server. Or in the worst case, the service may be forced to run on the affected memory until the high temperature condition abates. Both events constitute a downtime, and embodiments may be used to avoid or delay such thermal throttling.

Embodiments thus use spare memory devices to cause data to hop between two or more memory devices to address over-temperature conditions. Although the scope of the present invention is not limited in this regard, embodiments may be implemented in part by logic in an integrated memory controller (IMC) such as may be incorporated within a system on chip (SoC) or other processor.

Although the following embodiments are described with reference to energy conservation and energy efficiency in specific integrated circuits, such as in computing platforms or processors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to any particular type of computer systems. That is, disclosed embodiments can be used in many different system types, ranging from server computers (e.g., tower, rack, blade, micro-server and so forth), communications systems, storage systems, desktop computers of any configuration, laptop, notebook, and tablet computers (including 2:1 tablets, phablets and so forth), and may be also used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. More so, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future, such as for power conservation and energy efficiency in products that encompass a large portion of the US economy.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage to processor 110.

As seen, processor 110 may be a single die processor including multiple cores $120_a$-$120_n$. In addition, each core may be associated with an integrated voltage regulator (IVR) $125_a$-$125_n$ which receives the primary regulated voltage and generates an operating voltage to be provided to one or more agents of the processor associated with the IVR. Accordingly, an IVR implementation may be provided to allow for fine-grained control of voltage and thus power and performance of each individual core. As such, each core can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. During power management, a given power plane of one IVR may be powered down or off when the processor is placed into a certain low power state, while another power plane of another IVR remains active, or fully powered Still referring to FIG. 1, additional components may be present within the processor including an input/output interface 132, another interface 134, and an integrated memory controller (IMC) 136. As seen, each of these components may be powered by another integrated voltage regulator $125_x$.

In the embodiment shown, IMC 136 couples to a memory 140, which may be a system memory, e.g., implemented as a dynamic random access memory (DRAM). Memory 140 may include multiple devices or channels, and in some cases the devices can be partitioned into primary and secondary channels, where the primary channels are used for active storage and the secondary channels are held in reserve to be placed in service as needed, e.g., due to failures, errors, thermal conditions and so forth. In various embodiments, IMC 136 may include logic to perform dynamic hopping of information stored on a primary device to a secondary device, e.g., due to detection of a thermal condition on the primary device that exceeds at least a threshold level for a least a threshold duration, as will be described further herein.

In one embodiment, interface 132 may be in accordance with the Intel® Quick Path Interconnect (QPI) protocol, which provides for point-to-point (PtP) links in a cache coherent protocol that includes multiple layers including a physical layer, a link layer and a protocol layer. In turn, interface 134 may be in accordance with a Peripheral Component Interconnect Express (PCIe™) specification, e.g., the PCI Express™ Specification Base Specification version 2.0 (published Jan. 17, 2007).

Also shown is a power control unit (PCU) 138, which may include hardware, software and/or firmware to perform power management operations with regard to processor 110. As seen, PCU 138 provides control information to external voltage regulator 160 via a digital interface to cause the voltage regulator to generate the appropriate regulated voltage. PCU 138 also provides control information to IVRs 125 via another digital interface to control the operating voltage generated (or to cause a corresponding IVR to be disabled in a low power mode). In various embodiments, PCU 138 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or management power management source or system software).

While not shown for ease of illustration, understand that additional components may be present within processor 110 such as uncore logic, and other components such as internal memories, e.g., one or more levels of a cache memory hierarchy and so forth. Furthermore, while shown in the implementation of FIG. 1 with an integrated voltage regulator, embodiments are not so limited.

Note that the thermal and power management techniques described herein may be independent of and complementary to an operating system (OS)-based mechanism, such as the Advanced Configuration and Platform Interface (ACPI) standard (e.g., Rev. 3.0b, published Oct. 10, 2006). According to ACPI, a processor can operate at various performance states or levels, so-called P-states, namely from P0 to PN. In general, the P1 performance state may correspond to the highest guaranteed performance state that can be requested by an OS. In addition to this P1 state, the OS can further request a higher performance state, namely a P0 state. This P0 state may thus be an opportunistic or turbo mode state in which, when power and/or thermal budget is available, processor hardware can configure the processor or at least portions thereof to operate at a higher than guaranteed frequency. In many implementations a processor can include multiple so-called bin frequencies above the P1 guaranteed maximum frequency, exceeding to a maximum peak frequency of the particular processor, as fused or otherwise written into the processor during manufacture. In addition, according to ACPI, a processor can operate at various power states or levels. With regard to power states, ACPI specifies different power consumption states, generally referred to as C-states, C0, C1 to Cn states. When a core is active, it runs at a C0 state, and when the core is idle it may be placed in a core low power state, also called a core non-zero C-state (e.g., C1-C6 states), with each C-state being at a lower power consumption level (such that C6 is a deeper low power state than C1, and so forth).

Understand that many different types of power management techniques may be used individually or in combination in different embodiments. As representative examples, a power controller may control the processor to be power managed by some form of dynamic voltage frequency scaling (DVFS) in which an operating voltage and/or operating frequency of one or more cores or other processor logic may be dynamically controlled to reduce power consumption in certain situations. In an example, DVFS may be performed using Enhanced Intel SpeedStep™ technology available from Intel Corporation, Santa Clara, Calif., to provide optimal performance at a lowest power consumption level. In another example, DVFS may be performed using Intel TurboBoost™ technology to enable one or more cores or other compute engines to operate at a higher than guaranteed operating frequency based on conditions (e.g., workload and availability).

Another power management technique that may be used in certain examples is dynamic swapping of workloads between different compute engines. For example, the processor may include asymmetric cores or other processing engines that operate at different power consumption levels, such that in a power constrained situation, one or more workloads can be dynamically switched to execute on a lower power core or other compute engine. Another exemplary power management technique is hardware duty cycling (HDC), which may cause cores and/or other compute engines to be periodically enabled and disabled according to a duty cycle, such that one or more cores may be made inactive during an inactive period of the duty cycle and made active during an active period of the duty cycle. Although described with these particular examples, understand that many other power management techniques may be used in particular embodiments.

Figure 2:
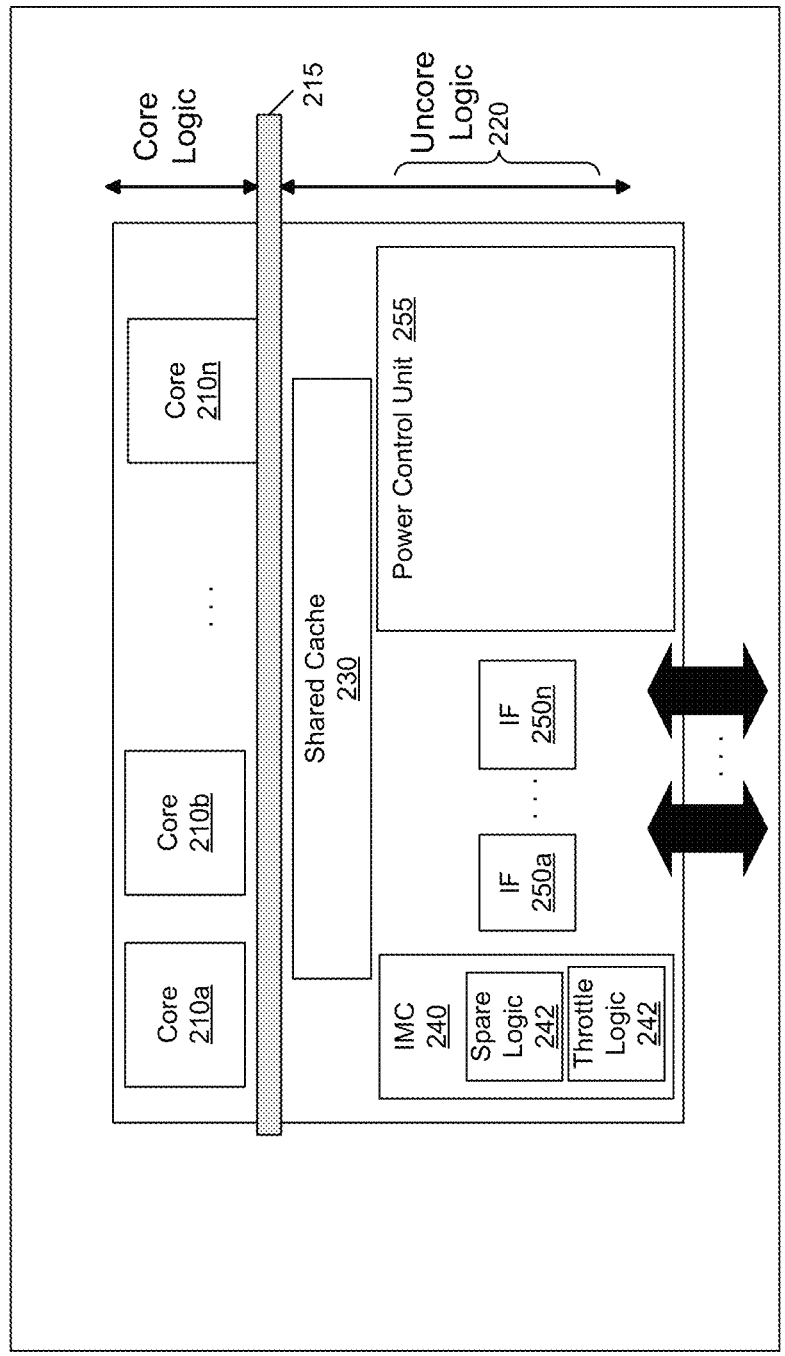
FIG. 2 is a block diagram of a processor in accordance with an embodiment of the present invention.

Embodiments can be implemented in processors for various markets including server processors, desktop processors, mobile processors and so forth. Referring now to FIG. 2, shown is a block diagram of a processor in accordance with an embodiment of the present invention. As shown in FIG. 2, processor 200 may be a multicore processor including a plurality of cores $210_a$-$210_n$. In one embodiment, each such core may be of an independent power domain and can be configured to enter and exit active states and/or maximum performance states based on workload. The various cores may be coupled via an interconnect 215 to a system agent or uncore 220 that includes various components. As seen, the uncore 220 may include a shared cache 230 which may be a last level cache. In addition, the uncore may include an integrated memory controller 240 to communicate with a system memory (not shown in FIG. 2), e.g., via a memory bus. As seen in FIG. 2, IMC 240 includes a spare logic 242 which may be configured to perform dynamic hopping of information stored on one memory device of the system memory to a different memory device of the system memory, e.g., due to detection of a thermal condition on the first memory device that exceeds at least a threshold level for a least a threshold duration. In addition, for more serious thermal conditions, e.g., after dynamic hopping performed by spare logic 242 becomes insufficient to reduce temperature to a desired level, IMC further include a throttle logic 244, which may be configured to throttle the amount of transactions to and from the system memory, to more fully handle a thermal condition. Uncore 220 also includes various interfaces 250 and a power control unit 255, which may include logic to perform the power management techniques described herein.

In addition, by interfaces 250a-250n, connection can be made to various off-chip components such as peripheral devices, mass storage and so forth. While shown with this particular implementation in the embodiment of FIG. 2, the scope of the present invention is not limited in this regard.

Figure 3:
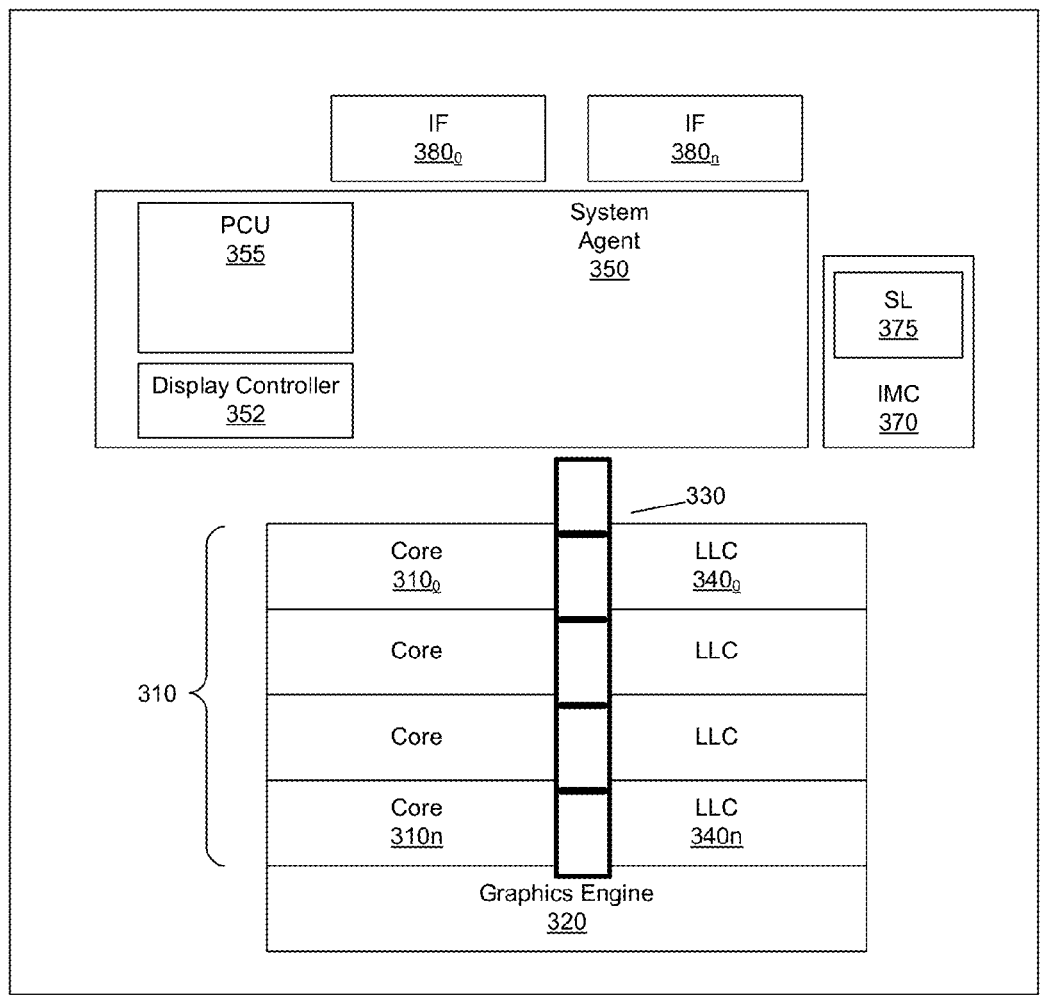
FIG. 3 is a block diagram of a multi-domain processor in accordance with another embodiment of the present invention.

Referring now to FIG. 3, shown is a block diagram of a multi-domain processor in accordance with another embodiment of the present invention. As shown in the embodiment of FIG. 3, processor 300 includes multiple domains. Specifically, a core domain 310 can include a plurality of cores $310_0$-$310_n$, a graphics domain 320 can include one or more graphics engines, and a system agent domain 350 may further be present. In some embodiments, system agent domain 350 may execute at an independent frequency than the core domain and may remain powered on at all times to handle power control events and power management such that domains 310 and 320 can be controlled to dynamically enter into and exit high power and low power states. Each of domains 310 and 320 may operate at different voltage and/or power. Note that while only shown with three domains, understand the scope of the present invention is not limited in this regard and additional domains can be present in other embodiments. For example, multiple core domains may be present each including at least one core.

In general, each core 310 may further include low level caches in addition to various execution units and additional processing elements. In turn, the various cores may be coupled to each other and to a shared cache memory formed of a plurality of units of a last level cache (LLC) $340_0$-$340_n$. In various embodiments, LLC 340 may be shared amongst the cores and the graphics engine, as well as various media processing circuitry. As seen, a ring interconnect 330 thus couples the cores together, and provides interconnection between the cores, graphics domain 320 and system agent circuitry 350. In one embodiment, interconnect 330 can be part of the core domain. However in other embodiments the ring interconnect can be of its own domain.

As further seen, system agent domain 350 may include display controller 352 which may provide control of and an interface to an associated display. As further seen, system agent domain 350 may include a power control unit 355 which can include logic to perform the power management techniques described herein.

As further seen in FIG. 3, processor 300 can further include an integrated memory controller (IMC) 370 that can provide for an interface to a system memory, such as a dynamic random access memory (DRAM). In the embodiment of FIG. 3, IMC 370 includes a spare logic 375, which may be configured as described above to perform dynamic hopping of information stored on one DIMM (or rank) to a different DIMM (or rank), responsive to detection of a thermal condition on the first DIMM that exceeds at least a threshold level for a least a threshold duration. While not shown for ease of illustration, understand that IMC 370 may further include a throttle logic. Multiple interfaces $380_0$-$380_n$ may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more interfaces in accordance with an Intel® Quick Path Interconnect (QPI) protocol may also be provided. Although shown at this high level in the embodiment of FIG. 3, understand the scope of the present invention is not limited in this regard.

Figure 4:
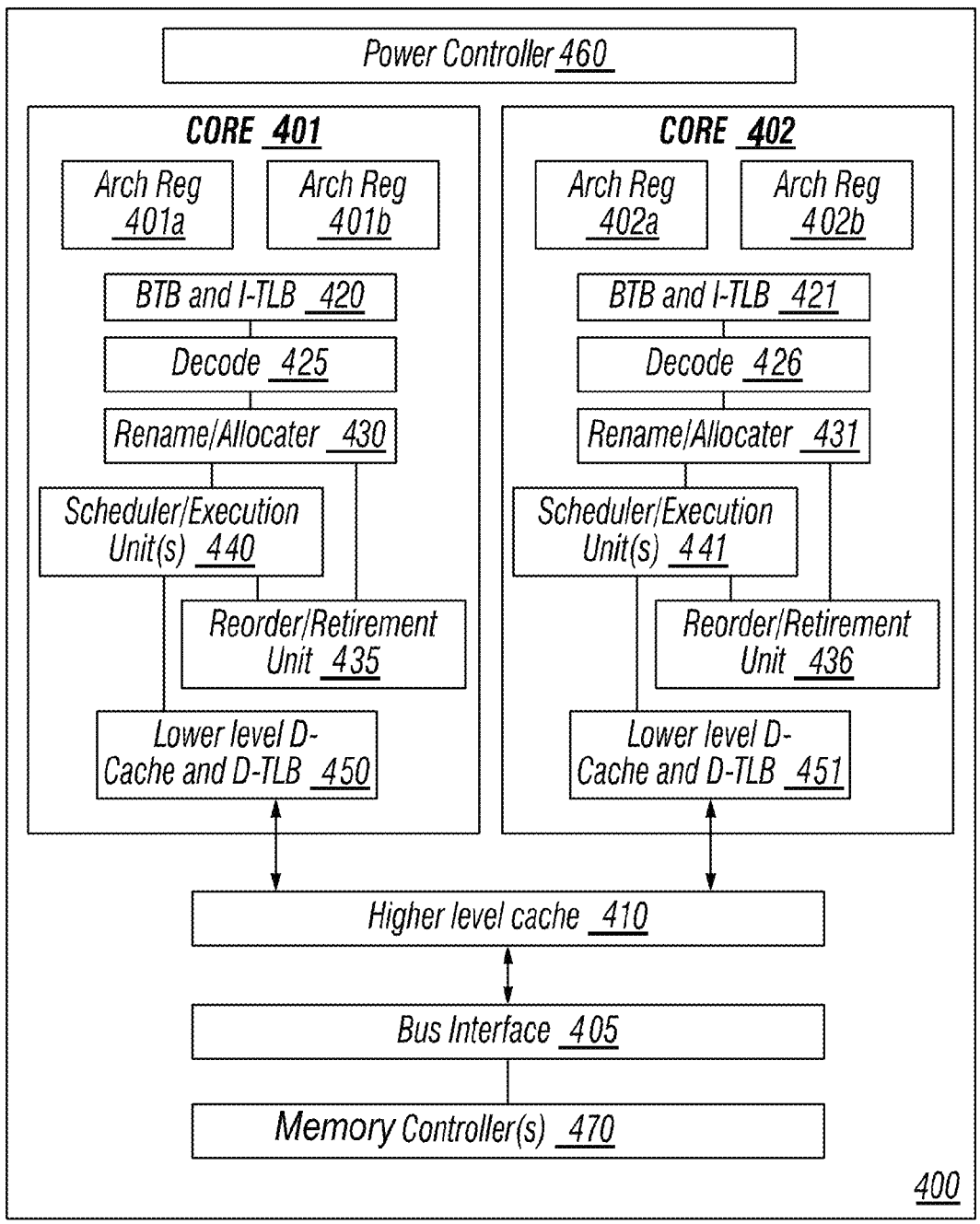
FIG. 4 is an embodiment of a processor including multiple cores is illustrated.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two hardware threads 401a and 401b, which may also be referred to as hardware thread slots 401a and 401b. Therefore, software entities, such as an operating system, in one embodiment potentially view processor 400 as four separate processors, i.e., four logical processors or processing elements capable of executing four software threads concurrently. As alluded to above, a first thread is associated with architecture state registers 401a, a second thread is associated with architecture state registers 401b, a third thread may be associated with architecture state registers 402a, and a fourth thread may be associated with architecture state registers 402b. Here, each of the architecture state registers (401a, 401b, 402a, and 402b) may be referred to as processing elements, thread slots, or thread units, as described above. As illustrated, architecture state registers 401a are replicated in architecture state registers 401b, so individual architecture states/contexts are capable of being stored for logical processor 401a and logical processor 401b. In core 401, other smaller resources, such as instruction pointers and renaming logic in allocator and renamer block 430 may also be replicated for threads 401a and 401b. Some resources, such as re-order buffers in reorder/retirement unit 435, ILTB 420, load/store buffers, and queues may be shared through partitioning. Other resources, such as general purpose internal registers, page-table base register(s), low-level data-cache and data-TLB 415, execution unit(s) 440, and portions of out-of-order unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments. The OOO core includes a branch target buffer 420 to predict branches to be executed/taken and an instruction-translation buffer (I-TLB) 420 to store address translation entries for instructions.

Core 401 further includes decode module 425 coupled to fetch unit 420 to decode fetched elements. Fetch logic, in one embodiment, includes individual sequencers associated with thread slots 401a, 401b, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode logic 425 includes circuitry that recognizes these instructions from their opcodes and passes the decoded instructions on in the pipeline for processing as defined by the first ISA. For example, decoders 425, in one embodiment, include logic designed or adapted to recognize specific instructions, such as transactional instruction. As a result of the recognition by decoders 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401a and 401b are potentially capable of out-of-order execution, where allocator and renamer block 430 also reserves other resources, such as reorder buffers to track instruction results. Unit 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder 425 to store recently decoded traces.

In the depicted configuration, processor 400 also includes bus interface module 405 and a power controller 460, which may perform power management in accordance with an embodiment of the present invention. In this scenario, bus interface 405 is to communicate with devices external to processor 400, such as system memory and other components.

A memory controller 470 may interface with other devices such as one or many memories, and may be configured to perform dynamic memory hopping as described herein. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Figure 5:
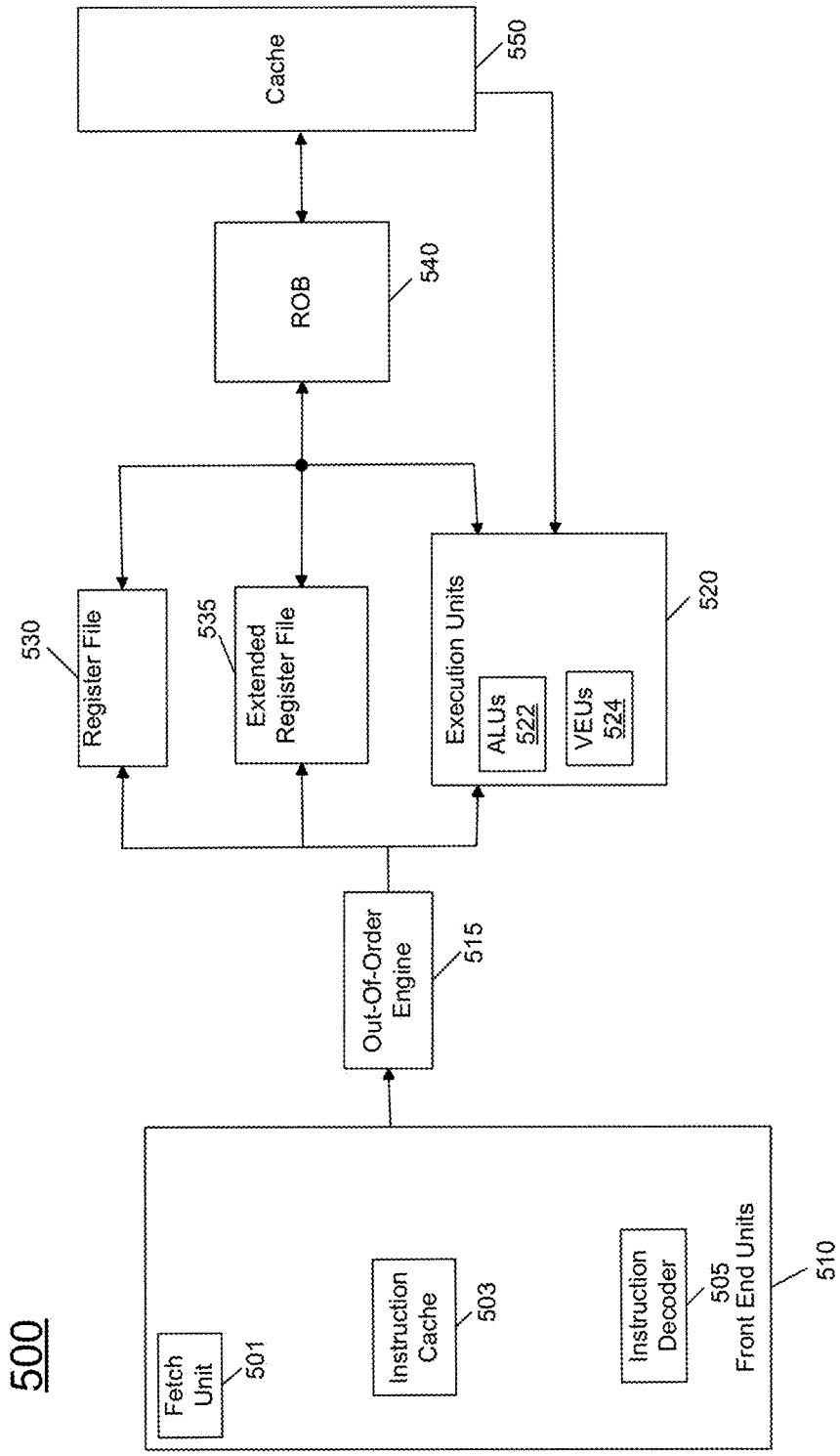
FIG. 5 is a block diagram of a micro-architecture of a processor core in accordance with one embodiment of the present invention.

Referring now to FIG. 5, shown is a block diagram of a micro-architecture of a processor core in accordance with one embodiment of the present invention. As shown in FIG. 5, processor core 500 may be a multi-stage pipelined out-of-order processor. Core 500 may operate at various voltages based on a received operating voltage, which may be received from an integrated voltage regulator or external voltage regulator.

As seen in FIG. 5, core 500 includes front end units 510, which may be used to fetch instructions to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. Extended register file 535 may provide storage for vector-sized units, e.g., 256 or 512 bits per register.

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 6:
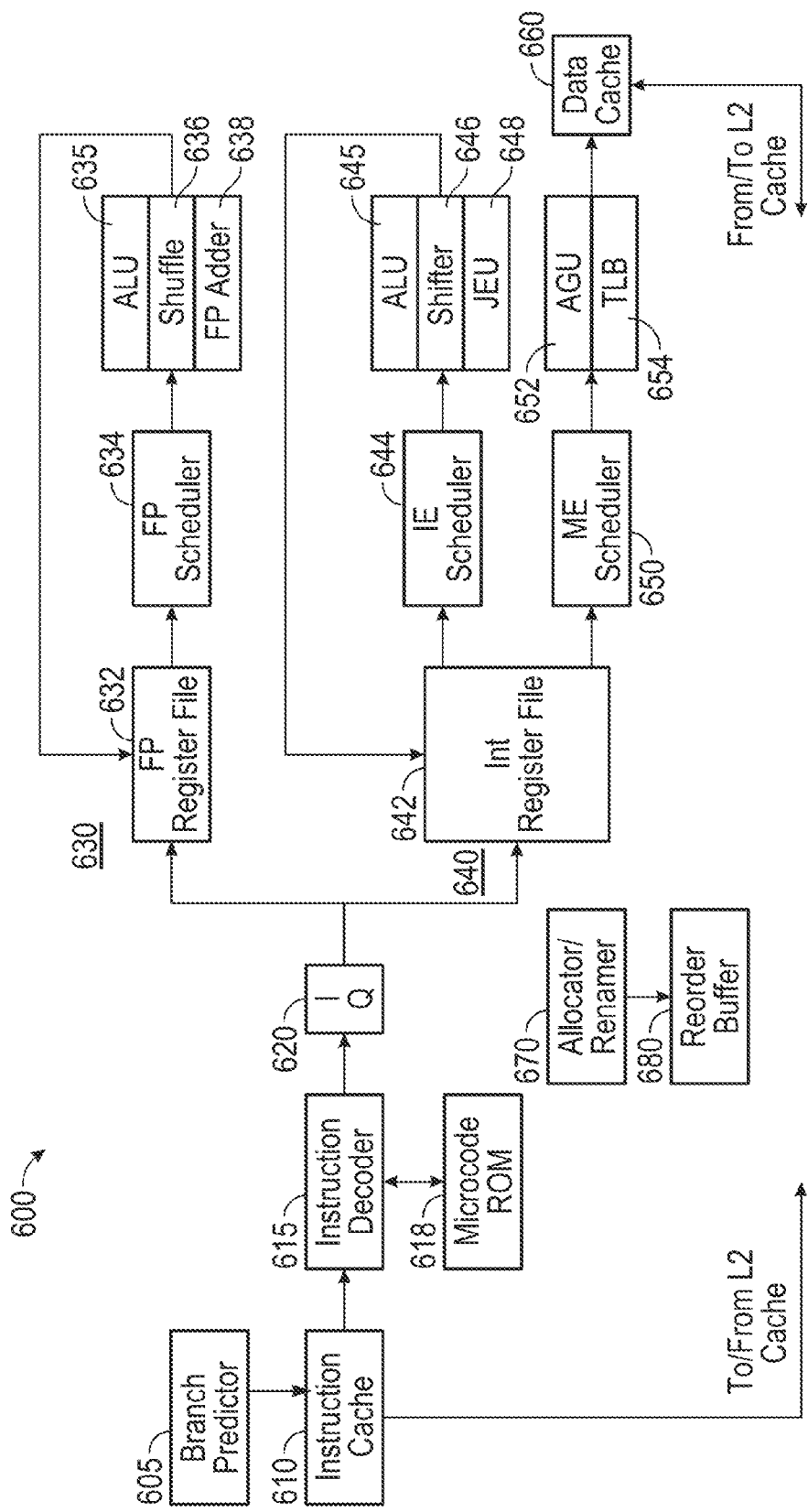
FIG. 6 is a block diagram of a micro-architecture of a processor core in accordance with another embodiment.

Referring now to FIG. 6, shown is a block diagram of a micro-architecture of a processor core in accordance with another embodiment. In the embodiment of FIG. 6, core 600 may be a low power core of a different micro-architecture, such as an Intel® Atom™-based processor having a relatively limited pipeline depth designed to reduce power consumption. As seen, core 600 includes an instruction cache 610 coupled to provide instructions to an instruction decoder 615. A branch predictor 605 may be coupled to instruction cache 610. Note that instruction cache 610 may further be coupled to another level of a cache memory, such as an L2 cache (not shown for ease of illustration in FIG. 6). In turn, instruction decoder 615 provides decoded instructions to an issue queue 620 for storage and delivery to a given execution pipeline. A microcode ROM 618 is coupled to instruction decoder 615.

A floating point pipeline 630 includes a floating point register file 632 which may include a plurality of architectural registers of a given bit with such as 128, 256 or 512 bits. Pipeline 630 includes a floating point scheduler 634 to schedule instructions for execution on one of multiple execution units of the pipeline. In the embodiment shown, such execution units include an ALU 635, a shuffle unit 636, and a floating point adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer register file 642 which may include a plurality of architectural registers of a given bit with such as 128 or 256 bits. Pipeline 640 includes an integer scheduler 644 to schedule instructions for execution on one of multiple execution units of the pipeline. In the embodiment shown, such execution units include an ALU 645, a shifter unit 646, and a jump execution unit 648. In turn, results generated in these execution units may be provided back to buffers and/or registers of register file 642. Of course understand while shown with these few example execution units, additional or different integer execution units may be present in another embodiment.

A memory execution scheduler 650 may schedule memory operations for execution in an address generation unit 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Figure 7:
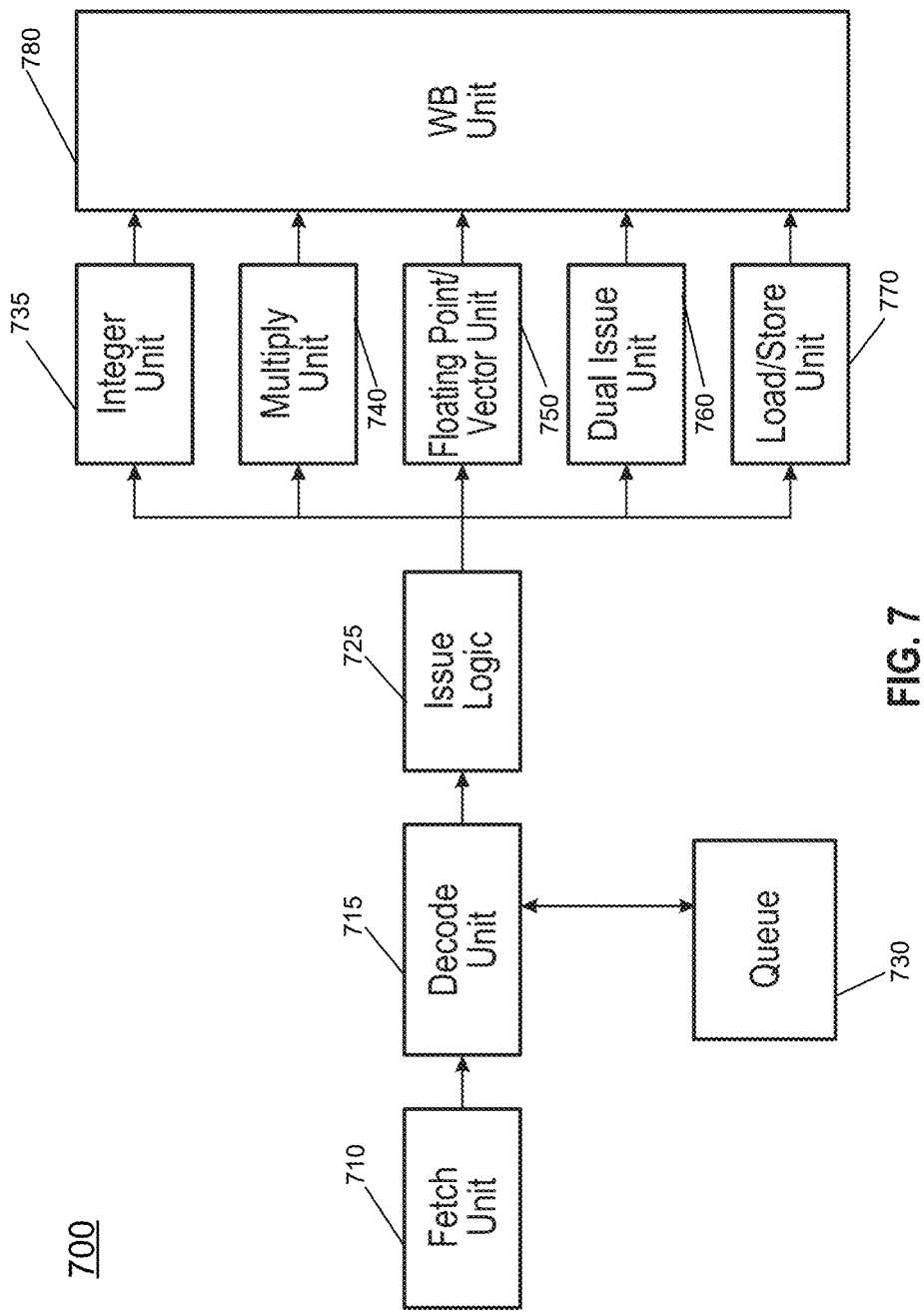
FIG. 7 is a block diagram of a micro-architecture of a processor core in accordance with yet another embodiment.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, processor 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Figure 8:
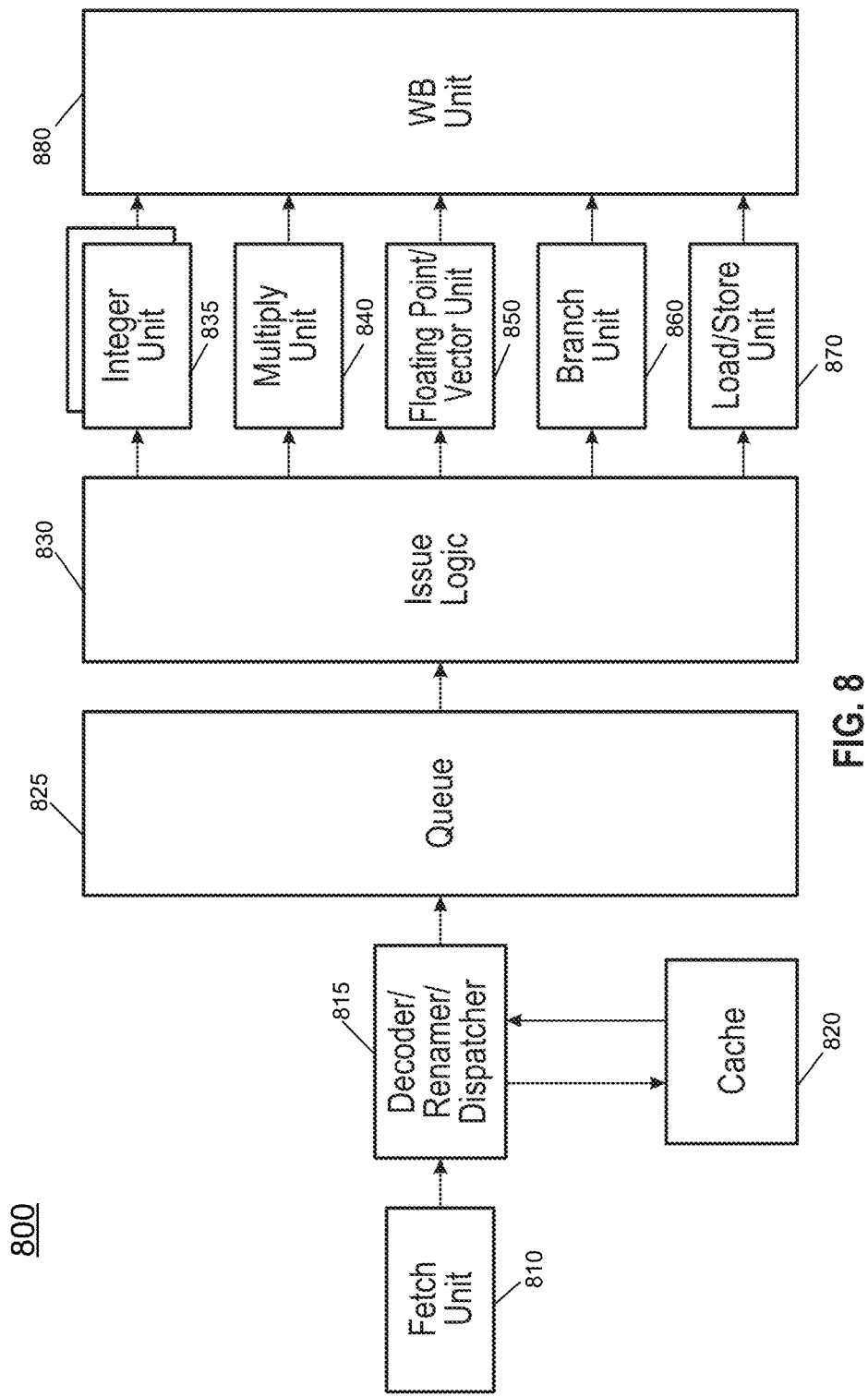
FIG. 8 is a block diagram of a micro-architecture of a processor core in accordance with a still further embodiment.

Referring to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions and provide them to a decoder/renamer/dispatcher 815, which may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Figure 9:
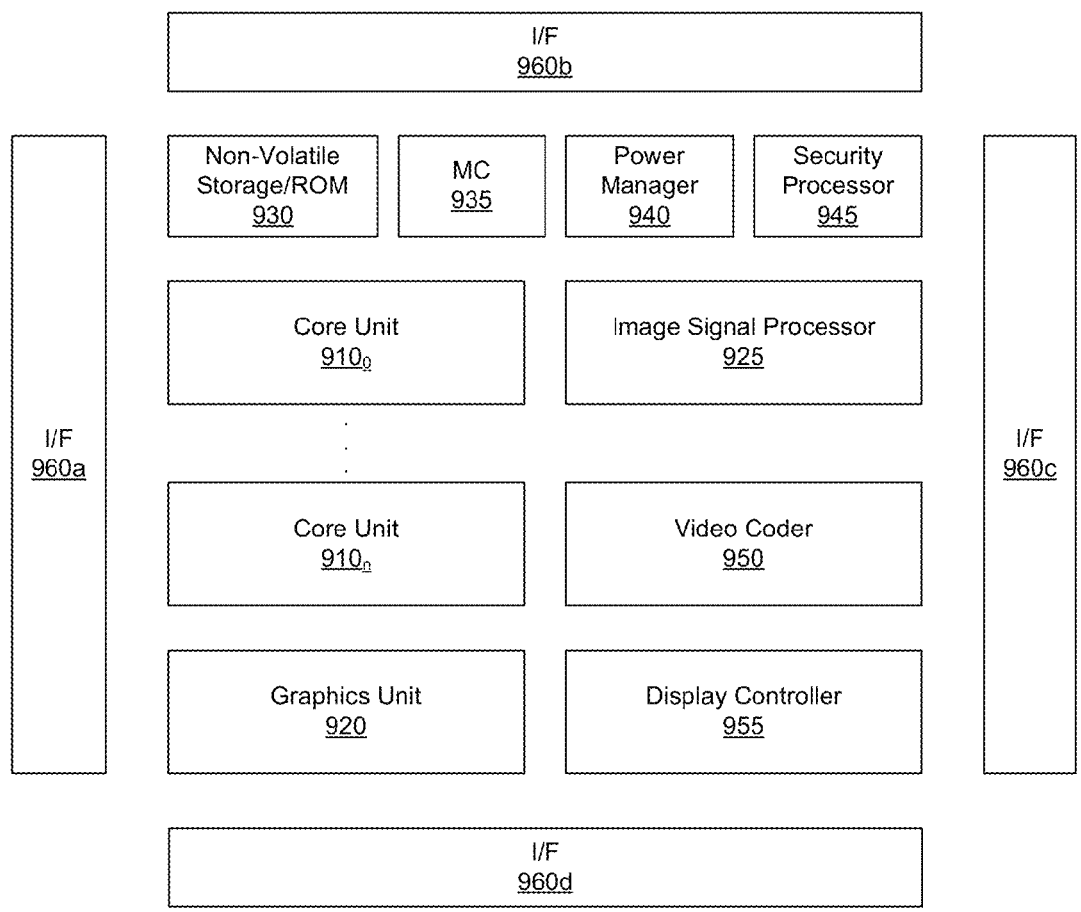
FIG. 9 is a block diagram of a processor in accordance with another embodiment of the present invention.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer or other portable computing device.

In the high level view shown in FIG. 9, processor 900 includes a plurality of core units $910_0$-$910_n$. Each core unit may include one or more processor cores, one or more cache memories and other circuitry. Each core unit 910 may support one or more instructions sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 9), and further may perform dynamic memory hopping and/or throttling as described herein.

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein.

In some embodiments, SoC 900 may further include a non-coherent fabric coupled to the coherent fabric to which various peripheral devices may couple. One or more interfaces 960a-960d enable communication with one or more off-chip devices. Such communications may be according to a variety of communication protocols such as PCIe™, GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Figure 10:
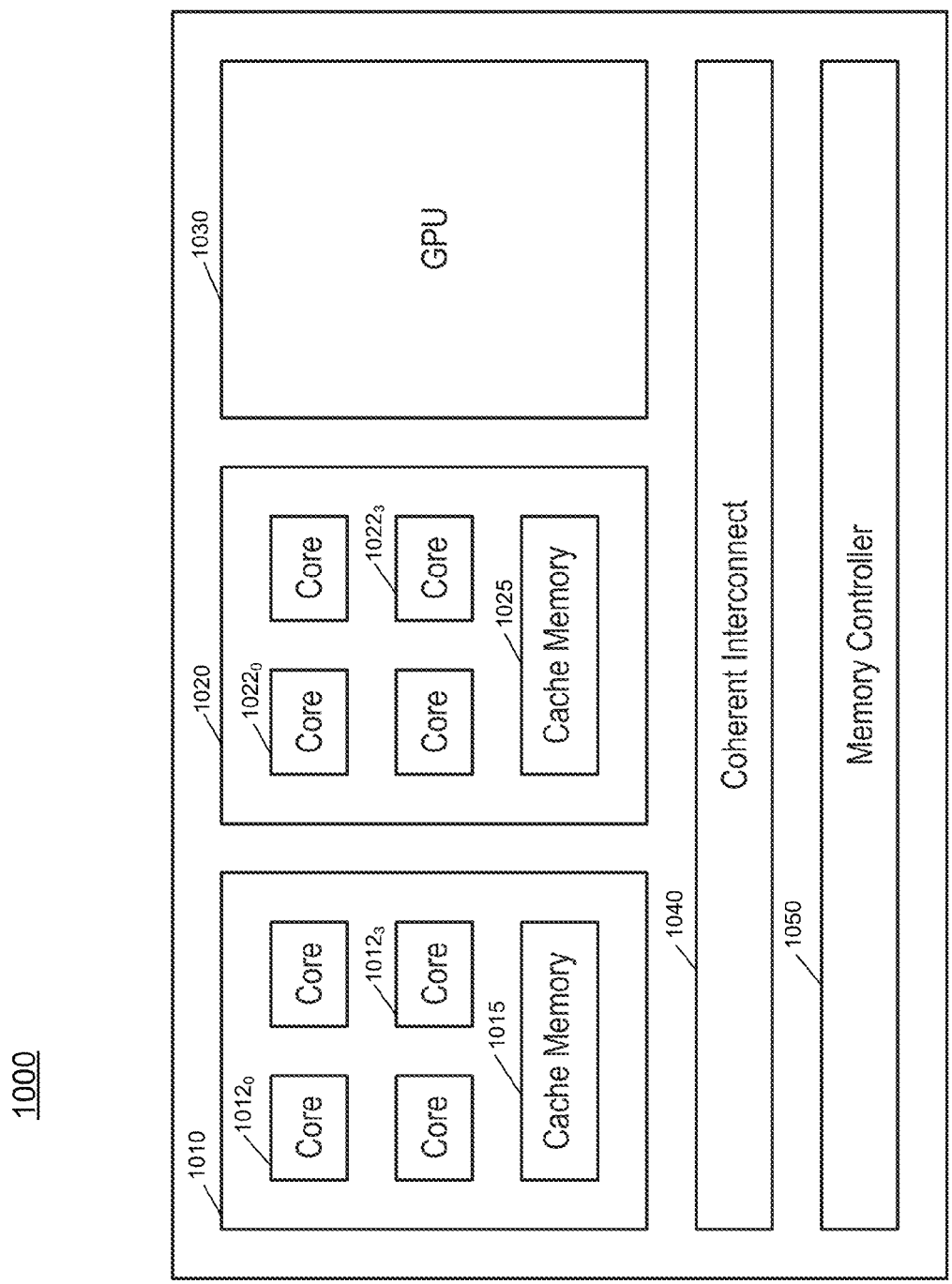
FIG. 10 is a block diagram of a representative SoC in accordance with an embodiment of the present invention.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device. As an example, SoC 1000 may be implemented using asymmetric or different types of cores, such as combinations of higher power and/or low power cores, e.g., out-of-order cores and in-order cores. In different embodiments, these cores may be based on an Intel® Architecture™ core design or an ARM architecture design. In yet other embodiments, a mix of Intel and ARM cores may be implemented in a given SoC.

As seen in FIG. 10, SoC 1000 includes a first core domain 1010 having a plurality of first cores $1012_0$-$1012_3$. In an example, these cores may be low power cores such as in-order cores. In one embodiment these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores $1022_0$-$1022_3$. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, some examples. In an embodiment, memory controller 1050 may be a direct memory controller to provide for multiple channels of communication with an off-chip memory, such as multiple channels of a DRAM (not shown for ease of illustration in FIG. 10), and further to perform dynamic memory hopping and/or throttling based on thermal conditions of the DRAM, as described herein.

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Figure 11:
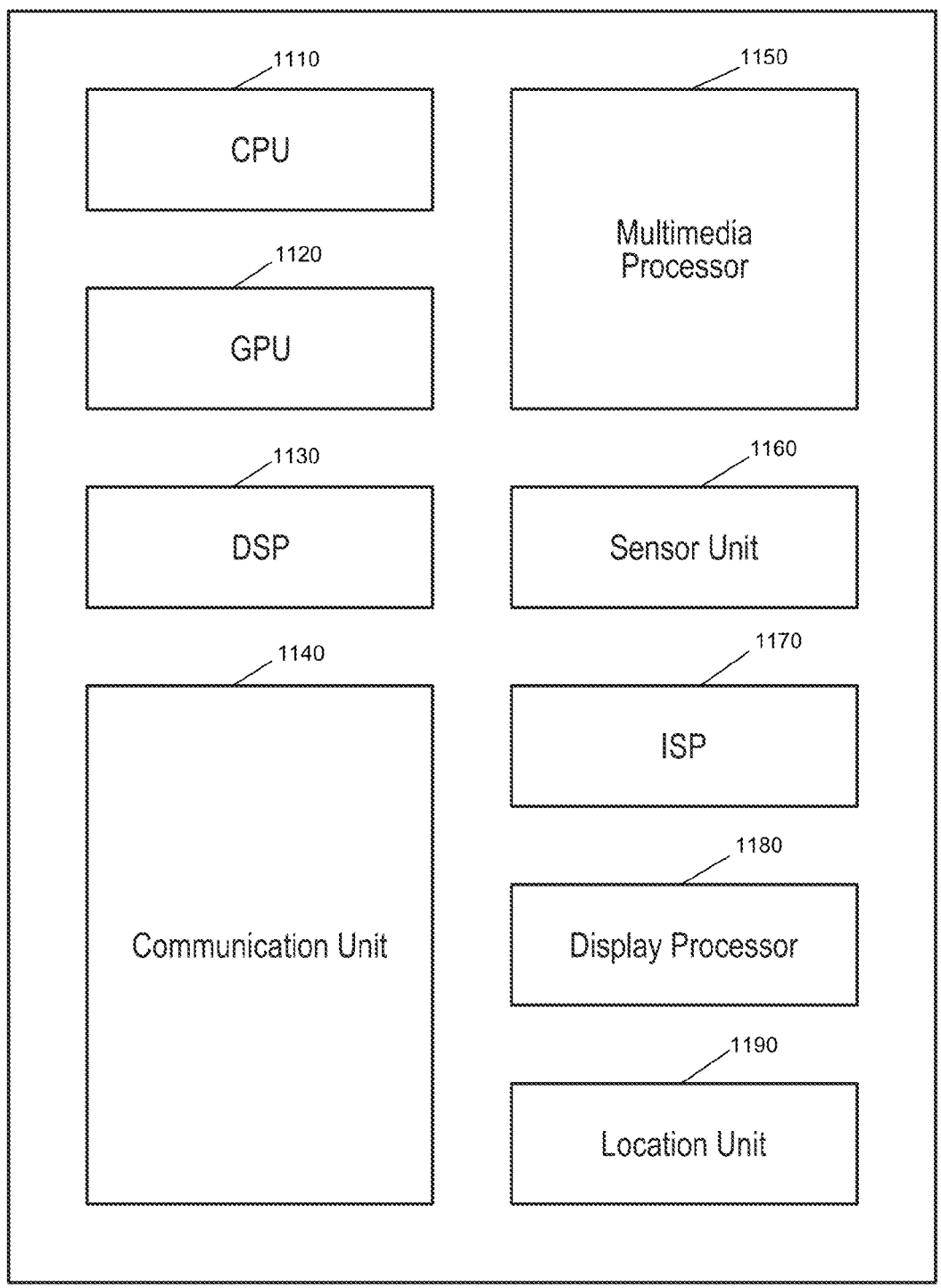
FIG. 11 is a block diagram of another example SoC in accordance with an embodiment of the present invention.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area techniques such as Bluetooth™, IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor 1170 may be provided with one or more separate ISPs to perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a GPS receiver with support for multiple GPS constellations to provide applications highly accurate positioning information obtained using as such GPS receiver. Understand that while shown with this particular set of components in the example of FIG. 11, many variations and alternatives are possible.

Figure 12:
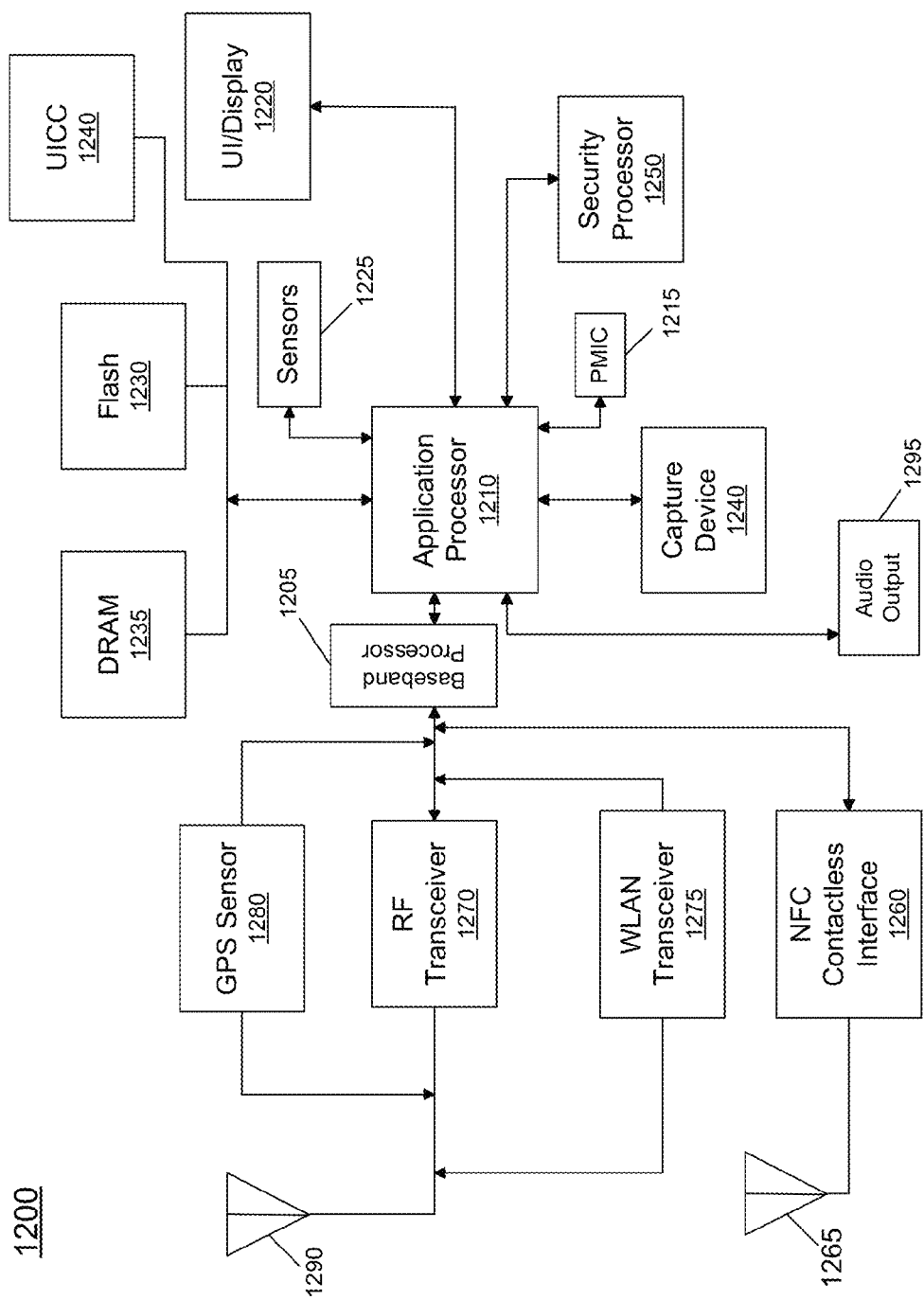
FIG. 12 is a block diagram of an example system with which embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. To this end, application processor 1210 may include an integrated memory controller to handle communications with DRAM 1235, and to perform dynamic memory hopping and/or memory thermal throttling as described herein. As further seen, application processor 1210 further couples to a capture device 1240 such as one or more image capture devices that can record video and/or still images.

Still referring to FIG. 12, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications, such as according to a Bluetooth™ standard or an IEEE 802.11 standard such as IEEE 802.11a/b/g/n can also be realized.

Figure 13:
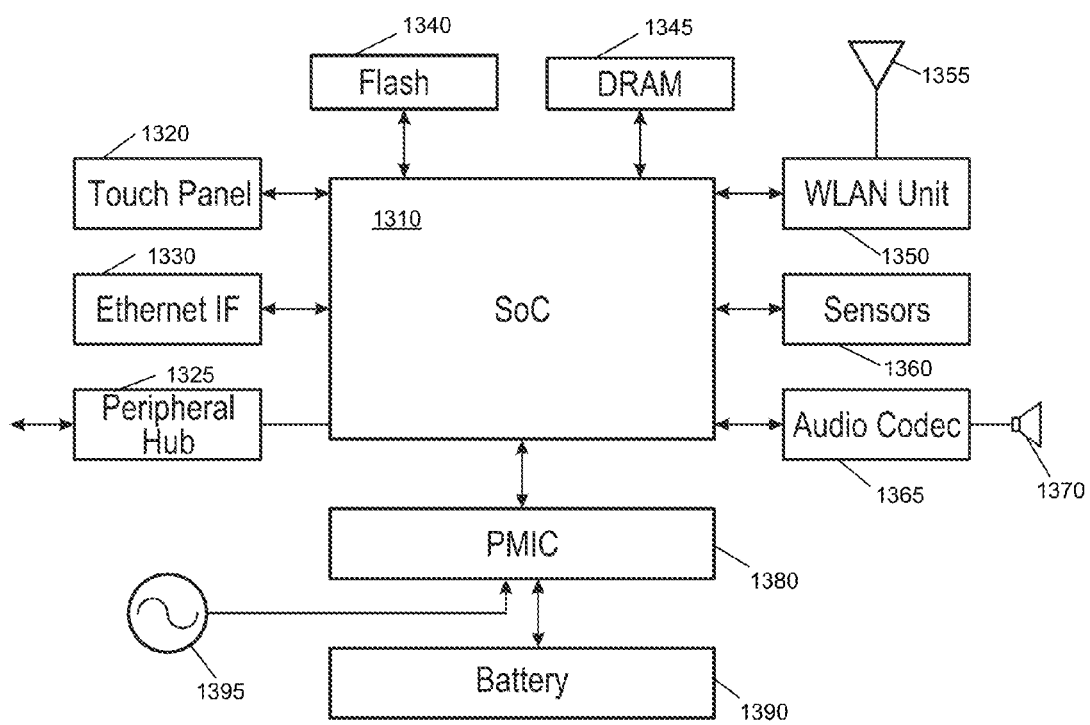
FIG. 13 is a block diagram of another example system with which embodiments may be used.

Referring now to FIG. 13, shown is a block diagram of another example system with which embodiments may be used. In the illustration of FIG. 13, system 1300 may be mobile low-power system such as a tablet computer, 2:1 tablet, phablet or other convertible or standalone tablet system. As illustrated, a SoC 1310 is present and may be configured to operate as an application processor for the device.

A variety of devices may couple to SoC 1310. In the illustration shown, a memory subsystem includes a flash memory 1340 and a DRAM 1345 coupled to SoC 1310. To this end, SoC 1310 may include an integrated memory controller to handle communications with DRAM 1345, and to perform dynamic memory hopping and/or memory thermal throttling as described herein. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols, including an IEEE 802.11 protocol, a Bluetooth™ protocol or any other wireless protocol.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Figure 14:
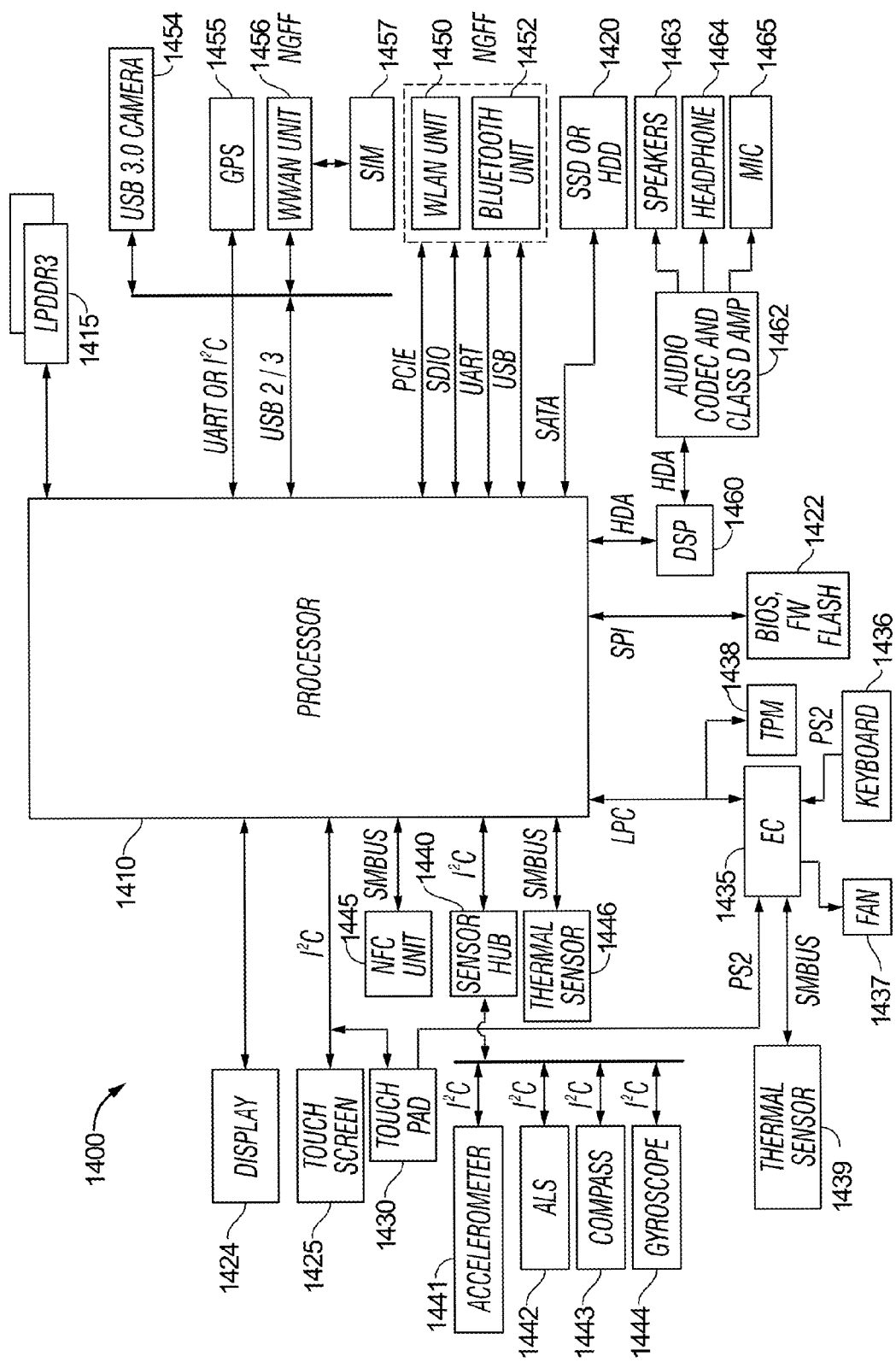
FIG. 14 is a block diagram of a representative computer system.

Referring now to FIG. 14, a block diagram of a representative computer system such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400. As one example, processor 1400 is implemented as a SoC.

Processor 1410, in one embodiment, communicates with a system memory 1415. As an illustrative example, the system memory 1415 is implemented via multiple memory devices or modules to provide for a given amount of system memory. Processor 1410, in an embodiment, includes an integrated memory controller to handle communications with system memory 1415, and to perform dynamic memory hopping and/or memory thermal throttling as described herein.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I$^2$C interconnect. As further shown in FIG. 14, in addition to touch screen 1425, user input by way of touch can also occur via a touch pad 1430 which may be configured within the chassis and may also be coupled to the same I$^2$C interconnect as touch screen 1425.

For perceptual computing and other purposes, various sensors may be present within the system and may be coupled to processor 1410 in different manners. Certain inertial and environmental sensors may couple to processor 1410 through a sensor hub 1440, e.g., via an I$^2$C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

Also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 in accordance with the Trusted Computing Group (TCG) TPM Specification Version 1.2, dated Oct. 2, 2003, may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth unit 1452. Using WLAN unit 1450, Wi-Fi™ communications in accordance with a given IEEE 802.11 standard can be realized, while via Bluetooth unit 1452, short range communications via a Bluetooth protocol can occur. These units may communicate with processor 1410 via, e.g., a USB link or a universal asynchronous receiver transmitter (UART) link. Or these units may couple to processor 1410 via an interconnect according to a PCIe™ protocol or another such protocol such as a serial data input/output (SDIO) standard.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given USB protocol such as a USB 2.0 or 3.0 link, or a UART or I²C protocol.

An integrated camera module 1454 can be incorporated in the lid. To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Figure 15:
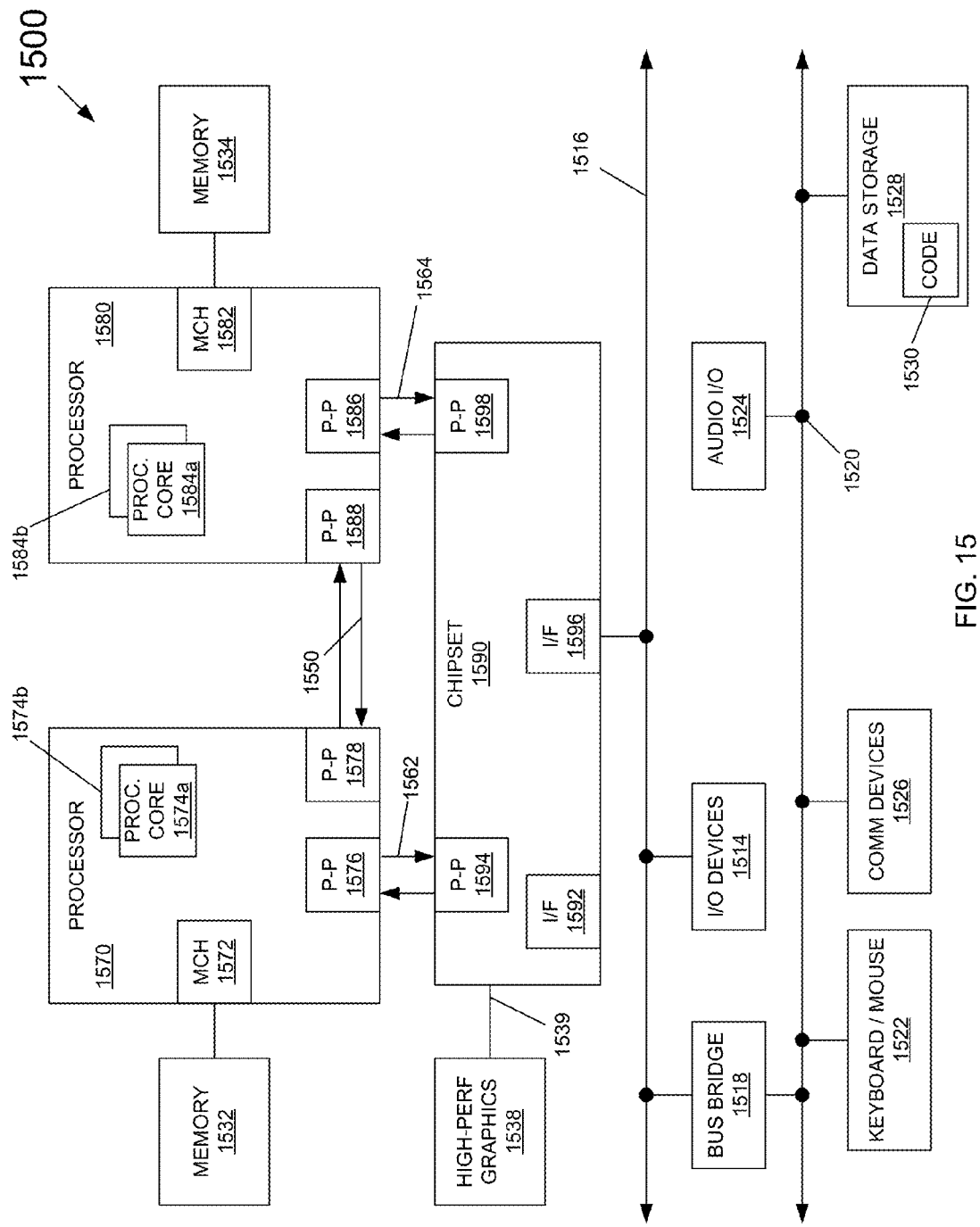
FIG. 15 is a block diagram of a system in accordance with an embodiment of the present invention.

Embodiments may be implemented in many different system types. Referring now to FIG. 15, shown is a block diagram of a system in accordance with an embodiment of the present invention. As shown in FIG. 15, multiprocessor system 1500 is a point-to-point interconnect system, and includes a first processor 1570 and a second processor 1580 coupled via a point-to-point interconnect 1550. As shown in FIG. 15, each of processors 1570 and 1580 may be multicore processors, including first and second processor cores (i.e., processor cores 1574a and 1574b and processor cores 1584a and 1584b), although potentially many more cores may be present in the processors. Each of the processors can include a PCU or other power management logic to perform processor-based power management as described herein.

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. In addition, each of MCH 1572 and 1582 can include spare logic and throttling logic to perform dynamic memory hopping and/or memory thermal throttling as described herein. First processor 1570 and second processor 1580 may be coupled to a chipset 1590 via P-P interconnects 1562 and 1564, respectively. As shown in FIG. 15, chipset 1590 includes P-P interfaces 1594 and 1598.

Furthermore, chipset 1590 includes an interface 1592 to couple chipset 1590 with a high performance graphics engine 1538, by a P-P interconnect 1539. In turn, chipset 1590 may be coupled to a first bus 1516 via an interface 1596. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

Figure 16A:
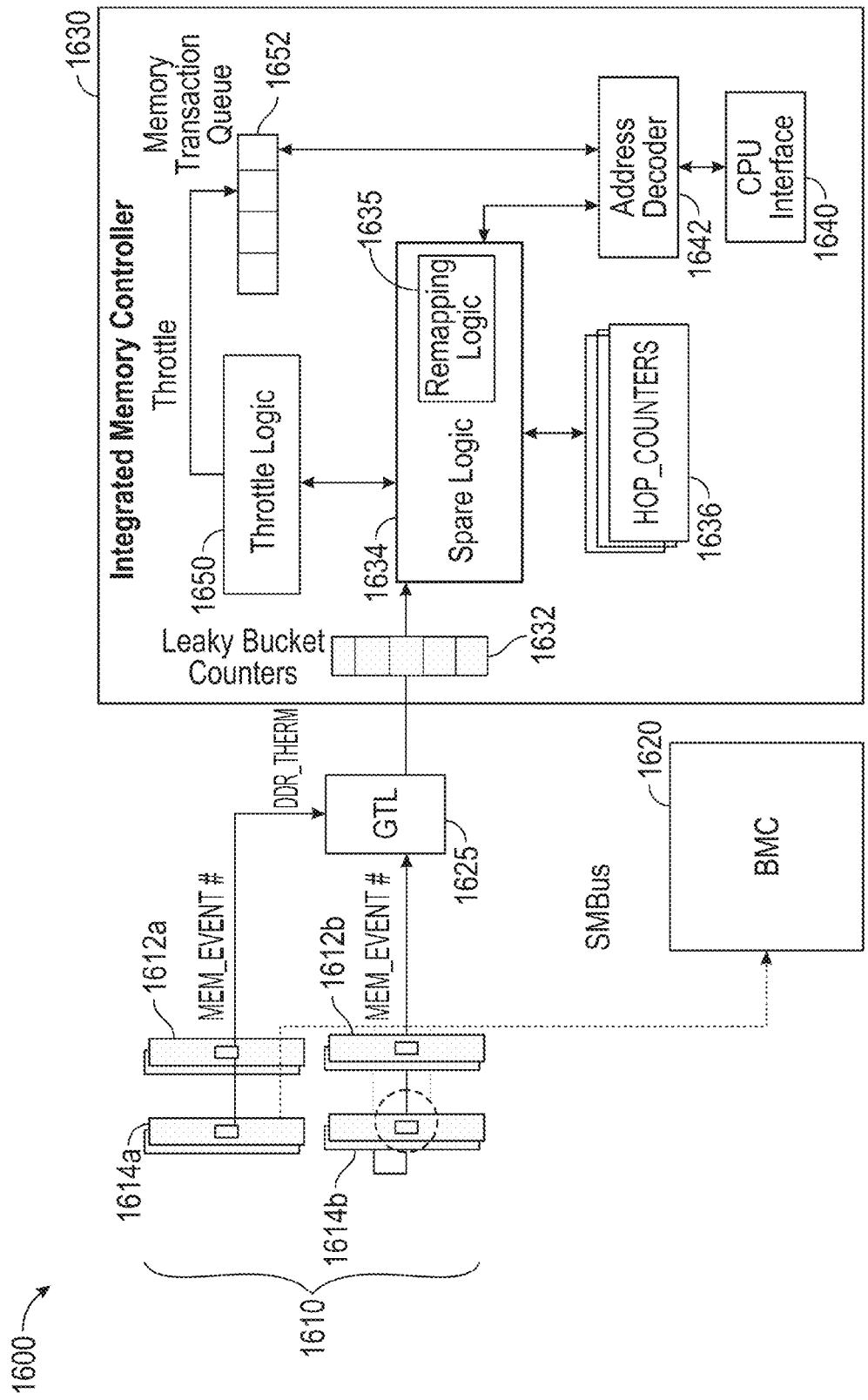
FIG. 16A is a block diagram of a portion of a system in accordance with an embodiment of the present invention.

Referring now to FIG. 16A, shown is a block diagram of a portion of a system in accordance with an embodiment. As shown in FIG. 16A, a portion of a system 1600 includes multiple memory devices of a system memory 1610 and a memory controller 1630, which may be an integrated memory controller of a SoC or other processor (the remainder of the processor is not shown in FIG. 16A). As seen, system memory 1610 may be implemented with a plurality of individual DIMMs, including a first primary DIMM 1612a and a second primary DIMM 1612b, and a first spare DIMM 1614a and a second spare DIMM 1614b. Each of these memory devices may include one or more thermal sensors and logic configured to communicate an over-temperature condition, which may be sent as a corresponding memory event (MEM_EVENT#) to a gate logic (GTL) 1625 of a memory interconnect that couples memory 1610 to IMC 1630. GTL 1625 may be a gating circuit to interface multiple DIMMs with memory controller 1630. In addition, the thermal information may be communicated to a baseboard management controller 1620 in an implementation in which system 1600 is of a multi-server environment, such as a server platform. Note that in some cases, baseboard management controller 1620 may be configured to perform platform-level thermal management (e.g., via the action of onboard fan devices) such that the dynamic memory hopping described herein occurs only after techniques of the platform-level thermal management become insufficient to maintain memory temperature within desired tolerances, for example, if the fans are operating at their maximum speed, beyond which they can offer no further cooling.

Still referring to FIG. 16A, memory controller 1630 is coupled to receive indications of memory events from the corresponding memory devices. When a given thermal event is communicated, activity may occur within a corresponding leaky bucket counter 1632 associated with the given memory device. As will be discussed further below, leaky bucket counters 1632 may be configured to measure the duration of a temperature excursion that may be allowed to occur before triggering a threshold event to a spare logic

1634. In various embodiments, spare logic 1634 includes associated logic/circuitry configured to perform spare failover, management of status and DIMM temperature monitoring.

To determine memory temperature, embodiments leverage temperature sensors on DIMM (TSOD), from which thermal information may be obtained and used by a memory controller or other logic. In some implementations, DIMMs may include additional (non-address/data) pins to report over-temperature conditions. In addition, the memory devices may be configured with logic programmed to signal an event on these pins when an over-temperature condition is detected such as whenever the TSOD temperature exceeds a threshold. In an embodiment, these additional thermal signals may be communicated from DIMMs to the memory controller using a sideband mechanism, e.g., an $I^2C$ bus. In different embodiments, spare logic 1634 either reads the thermal sensors on the memory devices, or is interrupted whenever the over-temperature condition occurs.

As seen in FIG. 16A, spare logic 1634 includes a remapping logic 1635 to perform address remapping as described herein. Spare logic 1634 may be activated using a temperature threshold event as received when a count value of a given leaky bucket counter 1632 exceeds a threshold, which indicates that the corresponding memory device has exceeded a thermal threshold for a threshold duration. In addition, a plurality of hop counters 1636 may couple to spare logic 1634. In different implementations, a single global hop counter may be present or multiple hop counters may be provided, each associated with a given memory device. In either case, hop counter 1636 is configured to maintain a count of dynamic hops that occur between corresponding primary memory devices and spare memory devices. When a given threshold count of such dynamic hops has occurred, spare logic 1634 may communicate with a throttle logic 1650, which may be configured to perform throttling of memory transactions when this threshold is reached, to enable further cooling to occur within the memory devices, at which point the hopping operation is brought to an end, and a performance impact sets in as a result of throttling.

As further illustrated in FIG. 16A, an address decoder 1642 couples to spare logic 1634 and further couples to a memory transaction queue 1652, which may store pending memory transactions to be sent to memory. As seen, when throttling is indicated, a throttle signal is sent from throttle logic 1650 to memory transaction queue 1652 to enable the throttling to occur. To effect communications with other portions of a processor, memory controller 1630 may further include a CPU interface 1640. In turn, CPU interface 1640 couples to address decoder 1642, which decodes addresses and interfaces with spare logic 1634 and memory transaction queue 1652.

Remapping logic 1635 is configured to redirect incoming memory requests to either a primary or spare device, e.g., based on whether an internal flag is set and the sparing feature is enabled. Spare logic 1634 may be configured to maintain spare DIMMs in a low power state when inactive. In an embodiment, spare logic 1634 may perform a spare copy flow to copy contents of a primary DIMM to a spare DIMM when hopping from primary to spare. The copy operation does a similar operation in the reverse direction (i.e., spare to primary) when performing a reverse hop. Together, the forward and reverse spare operations constitute a monolithic memory hop operation.

In an embodiment, failure prediction may be performed via temperature thresholds and the leaky bucket counters, both of which are programmable to allow the platform to determine an appropriate time to spare a hot rank or DIMM. To accomplish this, the processor can implement a leaky bucket counter per DIMM or rank to measure temperature excursions, and a temperature threshold per DIMM or rank. When the rank temperature exceeds the threshold value, the leaky bucket counter increments, and when the rank temperature returns below the threshold, the leaky bucket counter determents. Thus, the leaky bucket counter effectively measures a duration for which the temperature excursion is allowed to occur or be tolerated. If the rank temperature remains higher than the programmed threshold value for a duration greater than leaky bucket programmed value, a thermal event is signaled. The leaky bucket counter starts leaking the duration counter when the corresponding device temperature is below the threshold value, which accounts for hysteresis. Although shown at this high level in the embodiment of FIG. 16A, understand that variations and alternatives are possible.

Figure 16B:
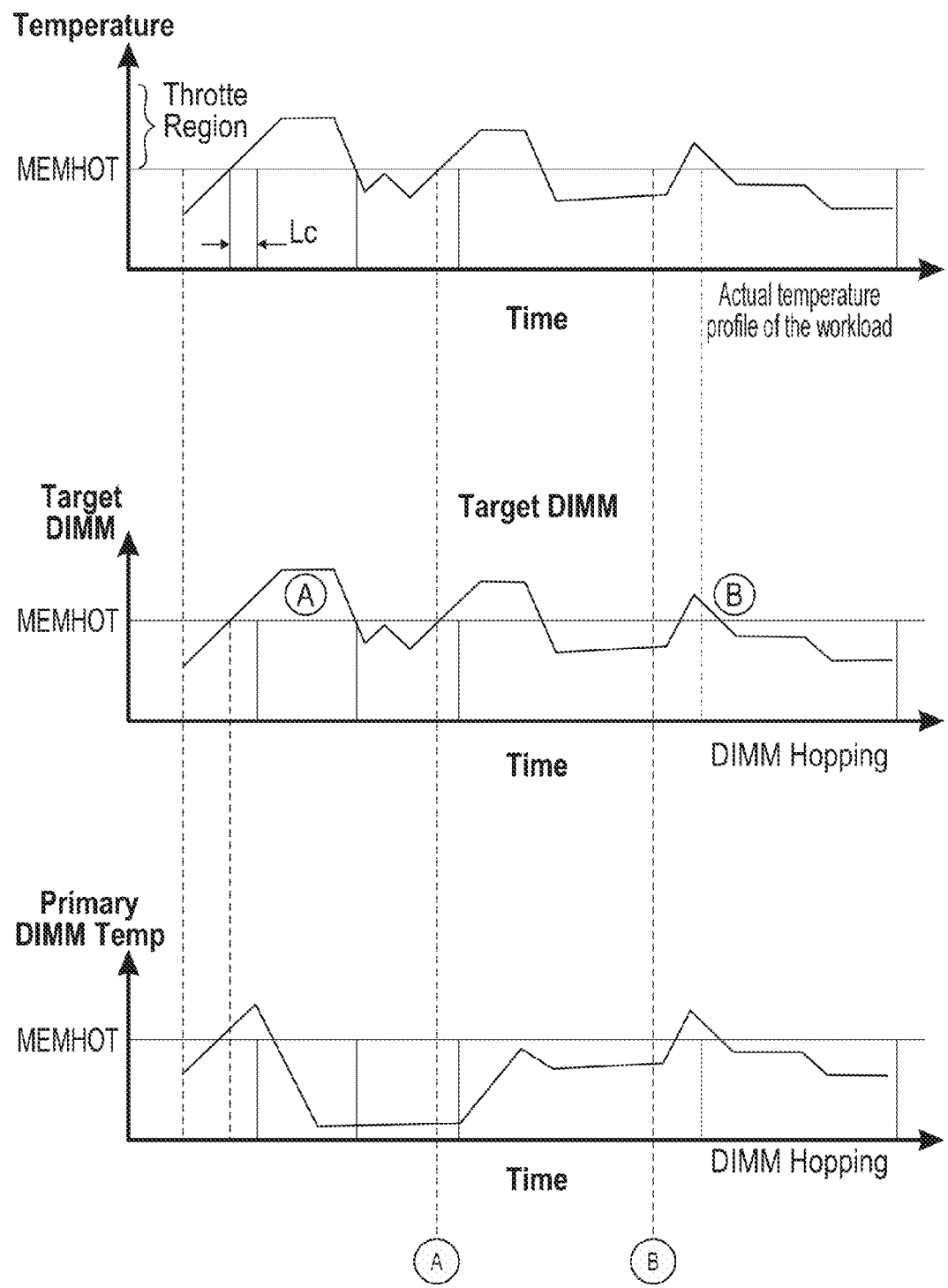
FIG. 16B is a timing diagram illustrating operation using an embodiment of the present invention.
Figure 16B:
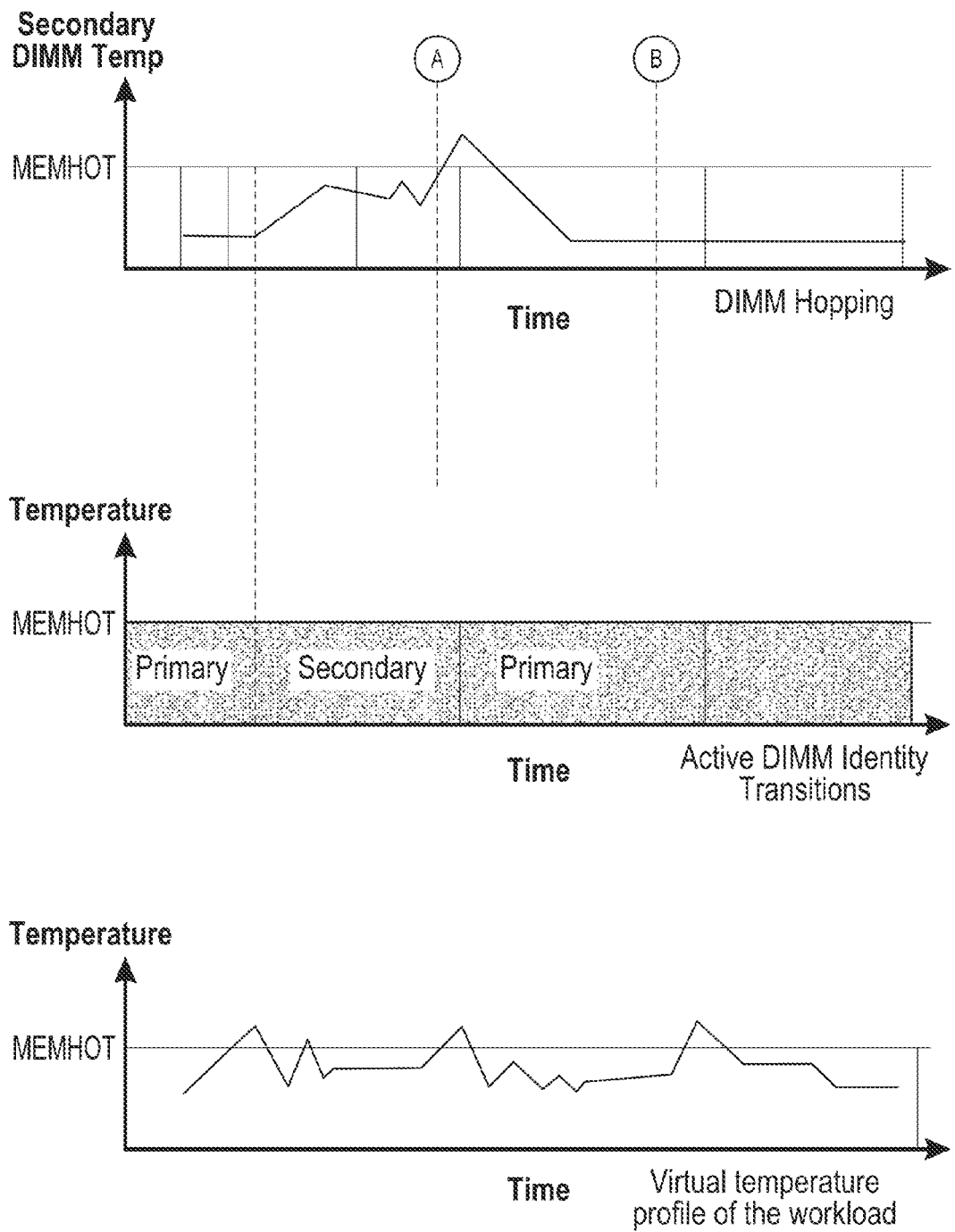

From a comparison of actual workload temperature profile and that of the primary and secondary DIMMs/channels shown in FIG. 16B, which is a timing diagram illustrating operation using an embodiment of the present invention, switching active roles between primary and secondary DIMMs/channels realizes an overall cooler memory subsystem that falls below a memory temperature threshold, MEMHOT. More specifically, FIG. 16B shows an actual temperature profile for a workload and a virtual temperature profile, which is the convolution of an overall temperature for primary and secondary memory devices as the workload dynamically hops between the devices. To prevent reactive hopping, a monitoring window is configured corresponding to a count per the leaky bucket counter (denoted as Lc at observation point A in FIG. 16B). This monitoring window occurs whenever the workload on a currently active memory causes an excursion above MEMHOT (the thermal threshold). If the excursion is sustained for a duration greater than Lc, the data stored in the primary memory is hopped to the secondary memory in order to cool down the primary memory to maintain the overall temperature profile below MEMHOT. As also seen in FIG. 16B, if the excursion above MEMHOT is only brief (e.g., during a "hot burst") as observed at observation point B, then data is not hopped, thereby optimizing overall performance. Thus only a single full cycle of memory hopping from primary to secondary and back to primary occurs in FIG. 16B.

Figure 17:
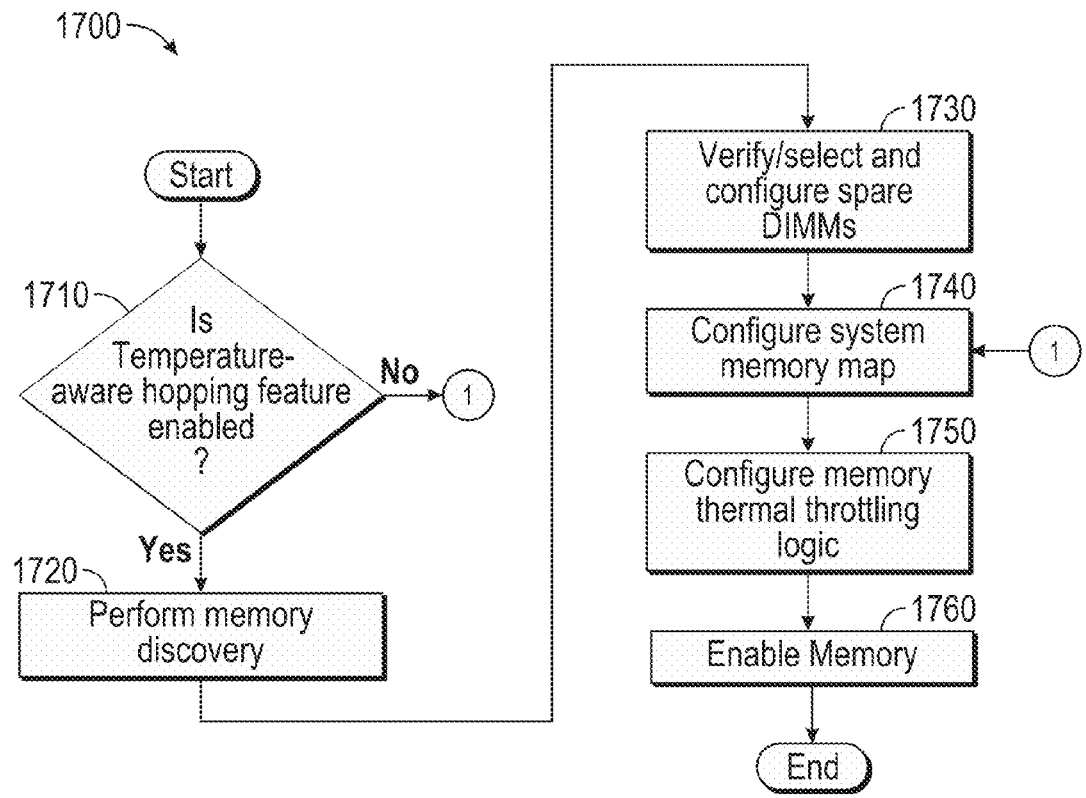
FIG. 17 is a flow diagram of a method in accordance with an embodiment of the present invention.

Referring now to FIG. 17, shown is a flow diagram of a method in accordance with an embodiment. More specifically, FIG. 17 shows a method 1700 which may be performed by system software, e.g., BIOS during memory initialization, such as may occur in a power on self-test (POST) portion of BIOS, to determine whether the temperature-aware memory hopping techniques described herein are to be enabled. As seen, method 1700 begins by determining whether a temperature-aware hopping technique is enabled (diamond 1710), e.g., as determined by reference to information in a configuration storage (described further as to FIG. 18). If so, control passes to block 1720 where a memory discovery operation may be performed. More specifically, in this operation a memory configuration may be determined, as well as a make and type of each memory device and each channel. Next control passes to block 1730 where one or more spare DIMMs or ranks can be verified/selected and configured. In an embodiment, this selection of a spare memory may be realized by selecting the largest DIMM or rank within a system as the spare memory device. Of course other manners of selection are possible.

Still referring to FIG. 17, next control passes to block 1740 where a system memory map may be configured. Note that control also passes here directly from diamond 1710 if it is determined that the temperature-aware memory hopping technique is not enabled.

Still referring to FIG. 17 control next passes to block 1750 where memory thermal throttling logic may be configured.

embodiments, there may be a control and status register pair per IMC, in an implementation including multiple memory controllers (and thus multiple spare logics, counters and so forth may be present).

Referring now to Table 1, shown are exemplary fields and field values of the configuration and status registers in accordance with an embodiment.

TABLE 1

| | | |
|---|---|---|
| EN | Thermal Hopping Enable. BIOS programs this field during memory discovery | 1b: Enable Thermal Hopping 0b: Disable Thermal Hopping |
| M | Beyond TSH, the number of ticks after which thermal monitoring will be started. | x: Thermal monitoring after x ticks |
| T | Thermal monitoring time window | x: Thermal monitoring window for N clocks |
| N | Thermal monitoring occurrences where temperature exceeds TSH within specified time window. Policy to trigger hopping if temperature exceeds N number of times within specified window. | x: Thermal monitoring occurrences within specified time window |
| TSH | Temperature threshold at which hopping is enabled. System software may program. In an embodiment, TSH is calculated as number of ticks of primary memory clock for which the memory controller waits before triggering a hop cycle. | Nb: Programmable field of N bits. |
| TCNT | Hop Count. The number of times hopping between DIMMs can be performed before relinquishing control to conventional thermal throttling. | Mb: Programmable field of N bits. |
| ACT | Status flag that indicates whether the thermal hopping engine (e.g., spare logic of FIG. 16A) is engaged or dormant. | 1b: Thermal Hopping engine is active. 0b: Thermal Hopping engine is not active. |
| HOP | Status flag that indicates thermal hopping condition has occurred. | 1b: Thermal Hopping condition has occurred. 0b: Thermal Hopping condition not occurred. |
| ERR | Field for reporting miscellaneous errors, such as configuration errors, sparing fail-over errors, etc. | Kb: Programmable field of K-bits. |
| RSVD | Reserved for future expansion | |
| CCNT | Number of hops performed so far. | Mb: Field of size M bits to match the control register definition. |
| Alternate MHOT | Temperature offset at which the hopping should occur, to ensure that the hopping does not occur too late (by which time the temperature rise may be beyond safety limits). This field can be programmed by system software. | |

As described above, such logic may be present within an integrated memory controller. Finally, at block 1760 the memory is enabled. Understand while shown at this high level in the embodiment of FIG. 17, many variations and alternatives of initializing a memory and enabling memory hopping as described herein are possible.

Figure 18:
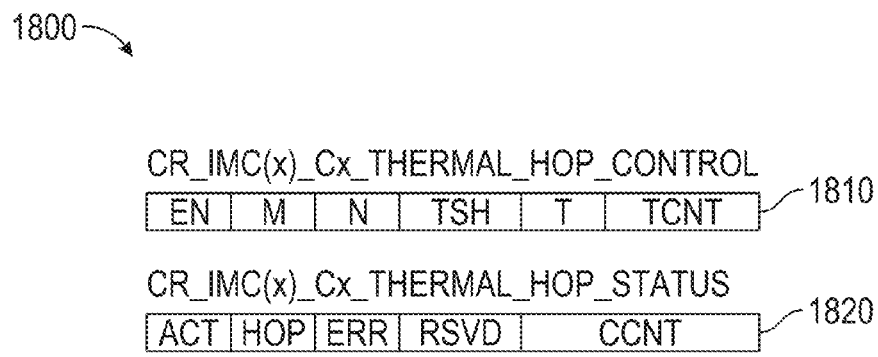
FIG. 18 is a block diagram of a configuration storage in accordance with an embodiment of the present invention.
Figure 19:
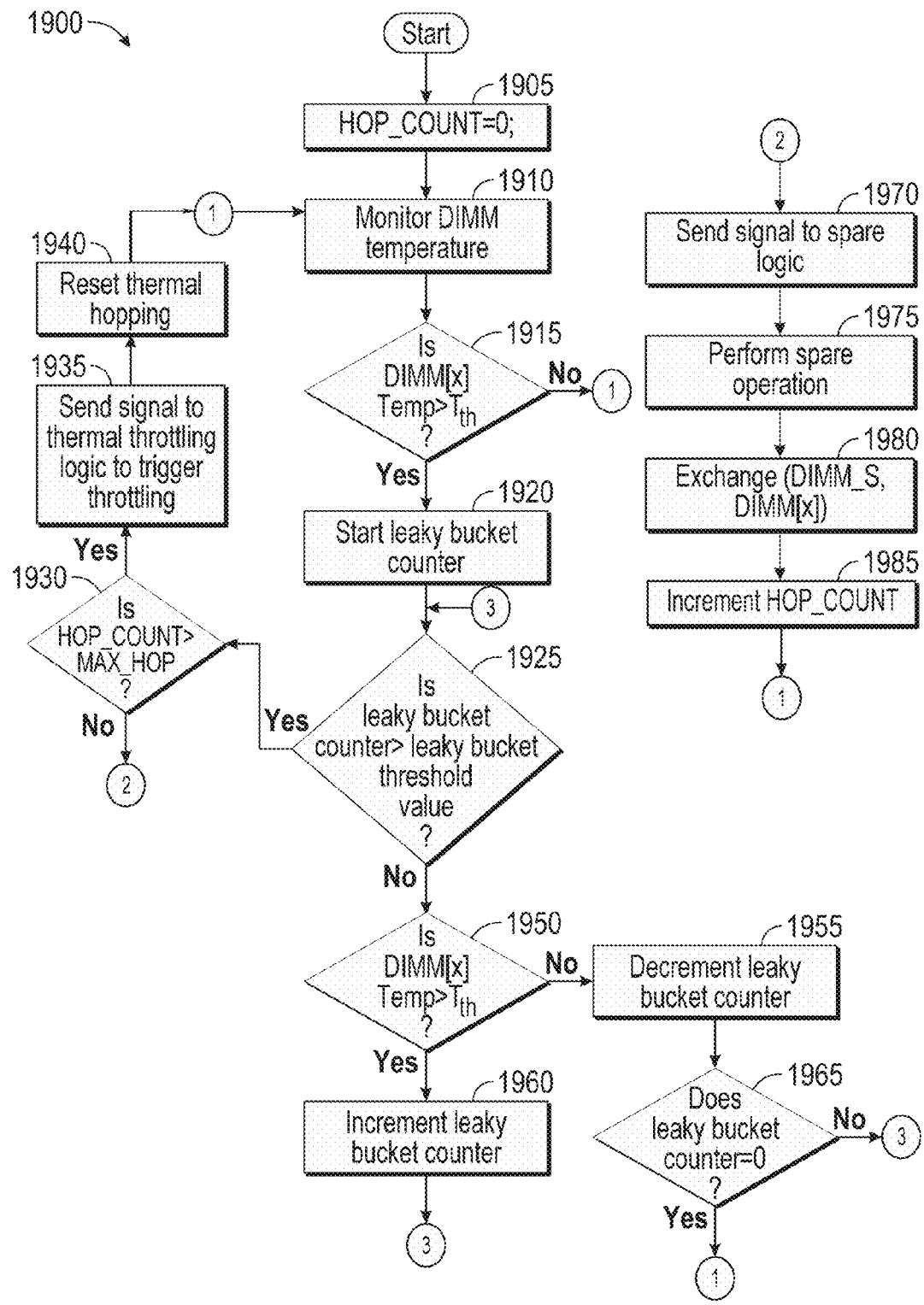
FIG. 19 is a flow diagram of a method for performing dynamic memory hopping in accordance with an embodiment of the present invention.

In an embodiment, memory hopping may be controlled by information stored in a control and status register pair, illustrated in FIG. 18. A configuration storage 1800 stores a set of control and status registers that provide an interface to software to initialize, configure and monitor dynamic hopping as described herein. As seen, configuration storage 1800 includes a memory hop configuration register 1810 and a memory hop status register 1820, each of which includes a plurality of fields to store different values. In an embodiment, values for the fields or parameters of the configuration storage may be set by system software (e.g., BIOS or OS) and/or under user control. In turn, the status values of status register 1820 may be used by the various logic described herein to perform memory sparing operations. In some Referring now to FIG. 19, shown is a flow diagram of a method for performing dynamic memory hopping in accordance with an embodiment of the present invention. As shown in FIG. 19, method 1900, which may be performed at least in part by spare logic within an integrated memory controller, begins by initializing a hop count to a predetermined value (e.g. zero) at block 1905. Next control passes to block 1910 where DIMM temperature may be monitored. Note that the monitoring may take different forms in different implementations. For example, in one embodiment at a predetermined periodicity, the IMC monitors TSODs on primary (active) DIMMs to determine whether a reported TSOD temperature value on a particular primary DIMM exceeds a programmable threshold.

Next at diamond 1915, it can be determined whether a DIMM temperature exceeds a thermal threshold. If so, control passes to block 1920 where a leaky bucket counter may be started. Note that in an embodiment, BIOS programs the leaky bucket threshold value with the maximum allowed duration for which a DIMM temperature excursion is to be measured. Next control passes to diamond 1925 to determine whether the leaky bucket counter value exceeds the leaky bucket threshold value. If not, control passes to diamond 1950 to determine whether the temperature still exceeds the temperature threshold, and if so, control passes to block 1960 where the leaky bucket counter may be incremented. Such operations may occur in a loop until the leaky bucket counter exceeds the threshold. Thus the IMC monitors TSODs on primary (active) DIMMs and increments the leaky bucket counters to measure the duration of a temperature excursion beyond a thermal threshold. In this way, the IMC initially accounts for hysteresis.

Once a hysteresis-related adjustment has been made and a temperature excursion is found to persist beyond the programmed leaky bucket threshold duration, a thermal hop spare event is triggered. More specifically, when it is determined at diamond 1925 that the leaky bucket counter value exceeds the threshold value, control passes to diamond 1930, to determine whether the hop count exceeds a maximum hop count value. If not, the thermal hop spare operations occur, beginning at block 1970, where a signal is sent to the spare logic to initiate a memory hop. In an embodiment, when the temperature exceeds the temperature threshold and remains persistent for the programmed duration, the IMC may set a hop indicator in a corresponding status register (e.g., for a hot rank) to generate a system management interrupt (SMI). In an embodiment, this indicator, once set, remains set until cleared by BIOS.

In an embodiment, a SMI or a machine check exception (MCE) may be raised to trigger this hop spare event. For example, an SMI may trigger a SMI handler to perform certain hop operations in BIOS and/or to inform system software for purposes of performing event logging. In certain embodiments, the generation of the signals (e.g., SMI/MCE) on the occurrence of a temperature-based thermal hopping event allows system software to quiesce portions of affected memory or other hardware, if needed, prior to the hopping operation.

Still further, using a machine check exception, an OS may be informed of the upcoming hop to enable the OS to choose certain memory regions within the larger memory device that are to be selected for exchanging such that the overhead incurred to dynamically hop all data stored in a memory from primary to secondary may be avoided. For example, in some embodiments the OS may provide information regarding one or more critical regions of data such that only a small portion of a relatively large memory device (e.g., a 1 terabyte (TB) DIMM) may actually be transferred responsive to the memory hopping.

At block 1975, various operations occur to perform a spare operation such that the contents of the primary memory device are transferred to the secondary memory device and addresses are remapped. In an embodiment, the spare operations may include the following. After a BIOS or OS returns from a SMI/MCE handler, and BIOS has quiesced other hardware, a spare copy operation is initiated from the primary DIMM to the spare DIMM. Also future accesses are remapped to the spare DIMM. Thereafter, the primary DIMM is placed into an electrical idle state. Then, the spare DIMM is set to an active state. In some embodiments, an optional signal (e.g., SMI/MCE) may be sent to system software for error handling and so forth.

Still referring to FIG. 19, at block 1980, an identification of the primary and secondary memories is swapped and the hop count is incremented at block 1985. Thus at this point, the identity of the two memory devices has been exchanged, and control returns (after hop count increment) to block 1910 to begin monitoring temperature of the spare DIMM.

Note that if it is determined at diamond 1950 that the memory temperature no longer exceeds the threshold level, control passes to block 1955, where the IMC leaks or decrements the leaky bucket counters in the case where the temperature excursion does not remain beyond the threshold temperature for the programmed threshold duration. Control passes from block 1955 to diamond 1965 to determine whether the leaky bucket counter equals a predetermined value (e.g., zero). If so, control returns to block 1910. If the leaky bucket counter does not equal zero, control passes to diamond 1925, discussed above.

Note that once a spare DIMM temperature reaches the temperature excursion threshold for longer than the programmed leaky bucket threshold duration, a reverse spare operation may be performed (in which the above sequence of operations with roles of primary and secondary reversed). Note that the hop counter is incremented when this reverse hop occurs. Note further that the spare hopping operations may be repeated as and when persistent temperature excursion condition occurs.

Still with reference to FIG. 19, if at diamond 1930, the hop counter count reaches a programmable threshold, MAX HOP (indicating that the abnormal thermal condition is persistent across multiple thermal hops), control passes to block 1935 where a signal is sent to a throttle logic, e.g., within memory controller, to trigger thermal throttling and further at block 1940 various count values associated with thermal hopping may be reset. Note that at block 1935, in addition to signaling for thermal throttling, various operations to disable additional dynamic memory hopping may be performed. In an embodiment, such operations may include: disabling the spare logic; quiescing the memory contents in the primary; setting one or more spare DIMMs to the electrical idle state; de-activating the one or more spare devices; and finally, sending the signal to the thermal throttling logic such that future thermal excursions are to be handled by the thermal throttle logic. While shown with this detail in FIG. 19, understand that the scope of the present invention is not limited in this regard and variations and alternatives are possible.

In various embodiments, user inputs may be used to enable effective thermal control of memory devices. In an embodiment, such user inputs can include hop count, threshold thermal temperature, and thermal monitoring time. The dynamic memory hopping techniques described herein may use these inputs to determine whether and when to hop memory content between memory devices (a spare and a primary) to handle temperature issues so as to prevent performance loss due to thermal throttling of transactions to memory.

The following examples pertain to further embodiments.

In one example, a processor comprises: at least one core to execute instructions; and a memory controller coupled to the at least one core. The memory controller may include a spare logic to cause a dynamic transfer of data stored on a first memory device coupled to the processor to a second memory device coupled to the processor, responsive to a temperature of the first memory device exceeding a thermal threshold.

In an example, the memory controller further comprises a plurality of first counters each associated with a memory device coupled to the processor and to count a duration of a temperature of the associated memory device exceeding the thermal threshold.

In an example, the spare logic is to cause the dynamic transfer further when a first counter of the plurality of first counters associated with the first memory device exceeds a second threshold.

In an example, the memory controller further comprises a second counter to count a number of times that the dynamic transfer has occurred between the first and second memory devices. The spare logic may update the second counter on occurrence of the dynamic transfer.

In an example, the spare logic, responsive to the second counter exceeding a third threshold, is to disable the dynamic transfer and to cause the first memory device to be throttled.

In an example, a configuration register may be configured to store the thermal threshold and the third threshold, and may be set by system software.

In an example, a status register may be configured to store a first status indicator to indicate whether the spare logic is active and a second status indicator to indicate whether at least one dynamic transfer has occurred.

In an example, the second memory device comprises a spare memory device, and the memory controller is to cause the second memory device to be in a low power state before the dynamic transfer.

In an example, the spare logic is further to: remap memory accesses from the first memory device to the second memory device; place the first memory device in an electrical idle state; and set the second memory device to an active state.

Note that the above processor can be implemented using various means.

In an example, the processor comprises a SoC incorporated in a user equipment touch-enabled device.

In another example, a system comprises a display and a memory, and includes the processor of one or more of the above examples.

In another example, a method comprises: updating a first counter while a temperature of a first memory device coupled to a processor exceeds a thermal threshold; and causing, during runtime of an application on the processor, an exchange of information between the first memory device and a second memory device coupled to the processor, responsive to the first counter exceeding a first threshold.

In an example, the method further comprises re-mapping first addresses within the first memory device to second addresses within the second memory device.

In an example, the method further comprises: updating a second counter responsive to the exchange; and preventing further exchanges between the first and second memory devices responsive to the second counter exceeding a second threshold. In an example, preventing the further exchanges comprises: quiescing the information in the first memory device; setting the second memory device to an electrical idle state; and de-activating the second memory device.

In an example, the method further comprises throttling at least one of the first and second memory devices responsive to the second counter exceeding the second threshold.

In an example, the method further comprises updating the first counter in a first direction if the temperature of the first memory device exceeds the thermal threshold, and updating the first counter in a second direction if the temperature of the first memory device does not exceed the thermal threshold.

In an example, the method further comprises: configuring a configuration register with the thermal threshold and the first threshold; and updating a first field of a status register responsive to the information exchange to indicate that at least one information exchange has occurred between the first and second memory devices.

In another example, a computer readable medium including instructions is to perform the method of any of the above examples.

In another example, an apparatus comprises means for performing the method of any one of the above examples.

In another example, a system comprises: a processor having at least one core to execute instructions and a memory controller to interface with a system memory, the memory controller including a dynamic hop logic to enable data stored in a first portion of the system memory to be dynamically transferred to a second portion of the system memory, when a temperature of the first portion of the system memory exceeds a threshold temperature for longer than a threshold duration; and the system memory including the first portion and the second portion.

In an example, the first portion of the system memory comprises a primary memory device and the second portion of the system memory comprises a secondary memory device, and the second portion of the system memory is to be activated when the first portion of the system memory exceeds the threshold temperature for longer than the threshold duration, and otherwise to be in a low power state.

In an example, the dynamic hop logic is to be activated when the first portion of the system memory exceeds the threshold temperature for longer than the threshold duration, and otherwise to be in a low power state.

Understand that various combinations of the above examples are possible.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
   at least one core to execute instructions, the at least one core including:
      an instruction fetcher to fetch instructions;
      an instruction decoder to decode the instructions; and
      one or more execution circuits to execute the decoded instructions; and
   a memory controller coupled to the at least one core, the memory controller including a first circuit to cause a dynamic transfer of data stored on a first memory device coupled to the processor to a second memory device coupled to the processor in response to a temperature of the first memory device that exceeds a thermal threshold, the first memory device to be placed in an electrical idle state, wherein after the dynamic transfer the memory controller is to remap memory accesses from the first memory device to the second memory device.

2. The processor of claim 1, wherein the memory controller further comprises a plurality of first counters each associated with a memory device and to count a duration of a temperature of the associated memory device that exceeds the thermal threshold.

3. The processor of claim 2, wherein the first circuit is to cause the dynamic transfer further when a first counter of the plurality of first counters associated with the first memory device exceeds a second threshold.

4. The processor of claim 2, further comprising a second counter to count a number of times that the dynamic transfer has occurred between the first and second memory devices.

5. The processor of claim 4, wherein the first circuit, in response to the second counter exceeding a third threshold, is to disable the dynamic transfer and to cause the first memory device to be throttled.

6. The processor of claim 5, further comprising a configuration register to store the thermal threshold and the third threshold, wherein the configuration register is to be set by system software.

7. The processor of claim 1, wherein the thermal threshold comprises a throttle threshold, and the first circuit is to cause the dynamic transfer of the data and not a thermal throttle of the first memory device in response to the first memory device temperature that exceeds the thermal threshold.

8. The processor of claim 1, wherein the first memory device comprises a first dual inline memory module and the second memory device comprises a second dual inline memory module.

9. The processor of claim 1, wherein the first memory device comprises a first memory channel and the second memory device comprises a second memory channel.

10. The processor of claim 1, wherein the first circuit is to receive first temperature information of the first memory device from one or more thermal sensors of the first memory device.

11. The processor of claim 1, wherein the second memory device comprises a spare memory device, and the memory controller is to cause the second memory device to be in a low power state before the dynamic transfer.

12. The processor of claim 1, wherein the first circuit is to cause the dynamic transfer further in response to the temperature that exceeds the thermal threshold for a threshold duration.

13. The processor of claim 12, wherein the first circuit is to generate a system management interrupt in response to the temperature that exceeds the thermal threshold for the threshold duration.

14. The processor of claim 1, wherein the first circuit is to inform an operating system regarding the dynamic transfer.

15. A non-transitory machine-readable medium having stored thereon instructions, which if performed by a machine cause the machine to execute a method comprising:
   updating a first counter while a temperature of a first memory device coupled to a processor exceeds a thermal threshold;
   sending a signal to the first memory device to cause, during runtime of an application on the processor, an exchange of information between the first memory device and a second memory device coupled to the processor, in response to the first counter exceeding a first threshold;
   updating a second counter in response to the exchange; and
   in response to the second counter exceeding a second threshold, throttling one of the first memory device and the second memory device.

16. The non-transitory machine-readable medium of claim 15, wherein the method further comprises preventing further exchanges in response to the second counter exceeding the second threshold.

17. The non-transitory machine-readable medium of claim 16, wherein preventing the further exchanges comprises:
   quiescing the information in the first memory device;
   setting the second memory device to an electrical idle state; and
   de-activating the second memory device.

18. A system comprising:
   a processor having at least one core to execute instructions and an integrated memory controller to interface with a volatile system memory, the integrated memory controller including a dynamic hop circuit to enable data stored in a first portion of the volatile system memory to be dynamically transferred to a second portion of the volatile system memory when a temperature of the first portion of the volatile system memory exceeds a threshold temperature for longer than a threshold duration and without throttling of the first portion of the volatile system memory, wherein the second portion of the volatile system memory comprises a spare memory device;
   the volatile system memory including the first portion and the second portion; and
   a baseboard management controller coupled to the processor, wherein the integrated memory controller is to communicate thermal information regarding the volatile system memory to the baseboard management controller.

19. The system of claim 18, wherein the dynamic hop circuit is to be activated when the temperature of the first portion of the volatile system memory exceeds the threshold temperature for longer than the threshold duration, and otherwise to be in a low power state.

20. The system of claim 18, further comprising a plurality of fans, wherein the baseboard management controller is to control an operating speed of the plurality of fans.

* * * * *